(12) United States Patent
Raman et al.

(10) Patent No.: US 9,170,308 B2
(45) Date of Patent: Oct. 27, 2015

(54) CIRCUIT AND METHOD FOR BIASING A PLATE-SHAPED SENSOR ELEMENT OF SEMICONDUCTOR MATERIAL

(71) Applicant: MELEXIS TECHNOLOGIES N.V., Tessenderlo (BE)

(72) Inventors: Johan Raman, Knesselare (BE); Pieter Rombouts, Mariakerke (BE)

(73) Assignee: MELEXIS TECHNOLOGIES N.V., Tessenderlo (BG)

( * ) Notice: Subject to any disclaimer, the term of this patent is extended or adjusted under 35 U.S.C. 154(b) by 69 days.

(21) Appl. No.: 14/055,703

(22) Filed: Oct. 16, 2013

(65) Prior Publication Data

US 2014/0103921 A1    Apr. 17, 2014

(51) Int. Cl.
*G01R 33/07* (2006.01)
*H01L 27/22* (2006.01)
(Continued)

(52) U.S. Cl.
CPC ............ *G01R 33/09* (2013.01); *G01R 33/007* (2013.01); *G01R 33/0023* (2013.01); *G01R 33/0041* (2013.01); *G01R 33/07* (2013.01)

(58) Field of Classification Search
CPC ............................... G01R 3/073; G01R 33/07
USPC ......................................................... 324/251
See application file for complete search history.

(56) References Cited

U.S. PATENT DOCUMENTS 3,443,234 A    5/1969 Bizet
3,613,021 A    10/1971 Scheidt
(Continued)

FOREIGN PATENT DOCUMENTS

CN    101290946 A    10/2008
JP      07244084 A     9/1995

OTHER PUBLICATIONS

Great Britain Search Report for corresponding GB application No. 1218580.7, mailed Feb. 5, 2013.
Matsui et al., "GaAs Hall Generator Application to a Current and Watt Meter", Proceedings of the 1st Sensor Symposium, 1981, pp. 37-40.
Mian et al., "The van der Pauw Stress Sensor," IEEE Sensors Journal, vol. 6, No. 2, Apr. 2006, p. 340-356.
(Continued)

*Primary Examiner* — Bot Ledynh
(74) *Attorney, Agent, or Firm* — Workman Nydegger

(57) ABSTRACT

Circuit and method for biasing a plate-shaped sensor element (2) made of doped semiconductor material and having a first resp. second excitation contact (C, A) connected to a first resp. second excitation node (Cn, An), and a first resp. second sense contact (B, D) connected to a first resp. second sense node (Bn, Dn). The plate-shaped sensor element is electrically isolated from a substrate or well (5) by means of a first PN-junction. The method comprises: a) applying to the first excitation node (Cn) a predefined first current ($I_{ex}$) generated by a first current source (11); b) applying to the second excitation node (An) a second current ($I'_{ex}$) generated by a controllable second source (12); c) controlling the second source (12) by means of a negative feedback loop based on a comparison between a value representative for a common mode voltage ($V_{cm}$) of the voltages (VB, VD) of the sense nodes (Bn, Dn) and a predefined reference voltage ($V_{ref}$), such that the common mode voltage ($V_{cm}$) is substantially equal to the reference voltage ($V_{ref}$).

16 Claims, 15 Drawing Sheets

(51) Int. Cl.
    *G01R 21/08* (2006.01)
    *G01R 33/09* (2006.01)
    *G01R 33/00* (2006.01)

(56) References Cited

U.S. PATENT DOCUMENTS

| | | |
|---|---|---|
| 3,882,409 A | 5/1975 | Yagi |
| 4,521,727 A | 6/1985 | Atherton et al. |
| 4,665,348 A | 5/1987 | Stupak, Jr. |
| 2009/0212765 A1 | 8/2009 | Doogue et al. |
| 2013/0082694 A1 * | 4/2013 | Lin et al. .................. 324/224 |

OTHER PUBLICATIONS

Popovic, "Hall Effect Devices, Second Edition", Sections 5.6.2-5.6.5, Taylor & Francis, 2004, Institute of Physics Publishing Inc.

Schott et al., "Linearizing Integrated Hall Devices", Transducers '97, International Conference on Solid State Sensors and Actuators, Chicago, Jun. 16-19, 1997, pp. 393-396.

Van Der Pauw, "A Method of Measuring the Resistivity and Hall Coefficient on Lamellae of Arbitrary Shape", Philips Technical Review, vol. 20, No. 8, 1958/59, p. 220-224.

Extended European Search Report from EP Application No. 13189012.1, Feb. 25, 2014.

\* cited by examiner

CIRCUIT AND METHOD FOR BIASING A PLATE-SHAPED SENSOR ELEMENT OF SEMICONDUCTOR MATERIAL

FIELD OF THE INVENTION

The present invention relates to the field of biasing plate-shaped sensor elements of semiconductor material, such as for instance Hall elements (also called "Hall plates"), in particular for example integrated junction-isolated Hall elements, or sensor elements having a Van der Pauw structures, such as for instance a Van der Pauw stress sensor.

BACKGROUND OF THE INVENTION

Plate-shaped sensor elements of semiconductor material are applied in Hall elements and in other sensor elements having a Van der Pauw structure, such as the stress sensor known from Mian, A.; Suhling, J. C.; Jaeger, R. C., "The van der Pauw stress sensor," Sensors Journal, IEEE, vol. 6, no. 2, pp. 340, 356, April 2006. Both the Hall elements and the sensor elements having a Van der Pauw structure are constructionally similar to one another, but use different measurements to derive information on the physical quantity to be measured (e.g. magnetic field versus stress).

Hall sensors are magnetic sensors based on the Hall effect, which was discovered by E. H. Hall in 1879. A basic Hall device consist of a conducting material provided with at least four electrical contacts. In order to make use of the Hall effect, a current has to flow through the device. A bias current I is supplied via two of the contacts, which will be referred to as the current contacts. Two other contacts, referred to as the sense contacts, are typically placed on an equipotential line, to make the voltage difference between the sense contacts zero in the absence of a magnetic field. The principle of measuring a magnetic field component Bz using a horizontal Hall element is illustrated in FIG. 1(a). For a Hall readout, the current contacts A, C and sense contacts B, D alternate with each other. If a current I is applied to the current contacts A, C, and if an out-of-plane magnetic field Bz is applied to the device, a Hall voltage $V_H$ proportional to the applied magnetic field Bz will appear between the sense contacts B, D; in other words, VH=VB−VD.

There are two common approaches for realizing the biasing current. One approach uses a current source, in which case the applied current I is precisely known ($I=I_{ex}$). A possible implementation of this case is shown FIG. 1(b). The other approach uses a voltage source, in which case the voltage over the plate is precisely defined ($V=V_{ex}$). An implementation of this type is shown in FIG. 1(c). When applying current-biasing, the voltage over the plate depends on the total resistivity of the plate. In the case of voltage-biasing, the current flowing through the plate is not exactly known, but is determined by the total resistivity of the plate.

Hall elements can easily be integrated in semi-conducting devices, e.g. in CMOS technology, which implies that they can be combined with advanced on-chip readout circuitry. An implication of the Hall device being co-integrated with other (e.g. readout) devices, is that the Hall element needs to be electrically isolated from the substrate and other components. In integrated technologies, this can be accomplished by using reverse-biased PN-junctions.

In FIG. 2, a cross section of an integrated horizontal Hall plate is shown, cut along the line where the excitation is applied (line through the contacts A and C in FIG. 1(a)). By way of example, a CMOS process using a p-type substrate has been illustrated. The actual Hall plate then consists of the n-type material of an n-well. In this example, also a p-type covering layer (top shield) is illustrated on top, which is often provided for one or more of various reasons (improved shielding, less noise of the device, etc). In FIG. 2, both substrate and top shield are connected to ground (0 V). During Hall readout, a current I has to flow through the plate. For this purpose, node A and node C must be at a different voltage. By way of example, it is assumed here that the applied biasing method results in 3.0 V at node A, and 1.0 V at node C. As is well known from the theory of PN-junctions, at any transition between p-type and n-type material a depletion region is formed. The biasing is done in such a way that the PN junctions are always reverse-biased. The reverse-biased transitions provide electrical isolation of the plate. The isolating depletion regions extend into the Hall plate, near the p-type substrate and the p-type cover (grayed areas in FIG. 2), and have a low number of free charge carriers (i.e. these regions can be considered as nearly perfect isolators). As a result, the effective thickness of the Hall plate is reduced. The actual size of the depletion zone varies in a non-linear way with the local (reverse) voltage over the PN-junctions. This reverse-voltage varies over the plate, being the largest at the node where the current enters (node A at higher potential), and the smallest at the node where the current leaves (node C at lower potential). As a result, the plate thickness (d1 in FIG. 2) at the high-voltage side is smaller than the plate thickness (d2 in FIG. 2) at the low-voltage side, implying a non-uniformity of the plate thickness in the direction from A to C. In other words, the thickness of the Hall plate is not constant, but varies over the plate. Unfortunately, when using current biasing, the effectively applied voltages (between nodes A and C) depend strongly on temperature, but also piezoresistive stress-effects and even the Hall effect itself affects the voltages (i.e. the voltages also vary in the X-direction of FIG. 2). Because these effects modulate the thickness of the plate, they affect the sensitivity and the linearity of the magnetic sensor.

An important characteristic of a Hall sensor is the (magnetic) sensitivity. Ideally, the sensitivity is a constant value, and the measured Hall voltage is a linear function of the magnetic field strength, independent of temperature, stress, etc. In practice, however, this is not entirely true. Yet, in many applications (such as for example in Hall-based linear current sensors), the absolute accuracy of the sensitivity is important. This means that the cross-sensitivities with environmental conditions like temperature, stress, etc. should be reduced, or that at least there is the possibility to compensate for them. Additionally, the dependence of the sensitivity on the Hall voltage, the latter being dependent on the applied magnetic field, implies that the sensor characteristic becomes a non-linear function of the magnetic field.

Several methods for reducing non-linearity due to the junction effect have been proposed in the prior art. In R. S. Popovic, "Hall Effect Devices, Second Edition", Taylor & Francis, ISBN 9780750308557, plate thickness modulation in junction-isolated Hall devices has been described. It has been identified as an additional source of non-linearity because of the modulation of the plate thickness by the Hall voltage itself.

FIG. 3 shows a circuit proposed for reducing this non-linearity. The dashed square represents the shield that surrounds the active area of the Hall device. However, this circuit may not be suitable for all contemporary CMOS technologies, as the potential of all the shielding regions cannot always be chosen freely. For instance, in many technologies with p-type substrate, the substrate must be at a fixed ground potential. Furthermore, the practical approach to biasing shown in FIG. 3 is not fully specified. It is only defined that one sense terminal is at a fixed potential, and a current I is flowing through the Hall plate. How this can be accomplished is not described.

Another prior art circuit as proposed by C. Schott and R. S. Popovic in "Linearizing integrated Hall devices", Transducers '97, International Conference on Solid State Sensors and Actuators, Chicago, 16-19 Jun. 1997, Vol. 1, pp. 393-396, is shown in FIG. 4. Also in this circuit, the shield voltage is driven, more particularly by signal dependent values determined by averaging the output voltages of the two sense contacts and subtracting therefrom a target reverse-bias voltage. The resulting voltage is then used to drive the shield. In practice, it is not always possible to change the potential of the shield, especially when the substrate is part of the surrounding shield. For instance, when the substrate defines the lower side of the Hall device, since the substrate is common for the whole chip, it therefore needs to be set at the lowest voltage (i.e. ground level) in case of a p-type substrate.

Two other prior art circuits as proposed by K. Matsui, S. Tanaka and T. Kobayashi in "GaAs Hall generator application to a current and watt meter", Proc. $1^{st}$ Sensor Symp. Ed. S. Kataoka (Tokyo: Institute of Electrical Engineers of Japan), pp. 37-40, 1981 are shown in FIG. 5, where the sensed voltage is amplified. In the circuit of FIG. 5(a), a large common mode voltage exists, which is disadvantageous for accurate amplification. That problem is solved in FIG. 5(b), where the left sense contact is kept at virtual ground by means of an Operational Amplifier OA. Thus the full Hall voltage appears at the right sense contact, which is amplified with respect to ground by amplifier A.

SUMMARY OF THE INVENTION

It is an object of embodiments of the present invention to provide a good method for biasing a plate-shaped sensor element made of doped semiconductor material.

In particular, it is an object of embodiments of the present invention to provide a method for biasing a plate-shaped sensor element made of doped semiconductor material which is better suitable for contemporary technologies, in particular CMOS technologies, and which has a similar performance as the prior art circuits, preferably even better.

These objectives are accomplished by a method and device according to embodiments of the present invention.

It is an advantage that embodiments of the present invention provide a circuit and method for biasing a plate-shaped sensor element of doped semiconductor material, for instance a Hall plate or another sensor element having a Van der Pauw structure, such that the circuit has a good linearity. A "good linearity" may be substantially similar, but may preferably be better than the linearity obtainable by means of prior art solutions.

It is an advantage of particular embodiments of the present invention that they provide a circuit and method for biasing a Hall plate such that the circuit has a low cross-sensitivity to piezoresistive stress effects. A "low cross-sensitivity" may be substantially similar, but preferably be better than the cross-sensitivity obtainable by means of prior art solutions.

It is an advantage of particular embodiments of the present invention that they provide a circuit and method for biasing a plate-shaped sensor element used for stress sensing such that the plate thickness near the center substantially remains constant, thus allowing to better measure the electrical conductivity properties of the material (which depend on the stress to be measured).

In a first aspect, the present invention provides a circuit, for instance an integrated circuit, comprising a plate-shaped sensor element made of doped semiconductor material, the plate-shaped sensor element having at least a first excitation contact connected to a first excitation node, and at least a second excitation contact connected to a second excitation node, and at least a first sense contact connected to a first sense node and at least a second sense contact connected to a second sense node. The plate-shaped sensor element is embedded into a substrate or well such that it can be isolated from the substrate or well by means of a first PN-junction, the substrate or well being connectable to a first fixed voltage. The circuit comprises: a) a first current source connectable to the first excitation node for applying a predefined first current, e.g. a DC-current; b) a controllable second source adapted for applying a second current to the second excitation node; c) a negative feedback loop for controlling the second source based on a comparison between a value representative for a common mode voltage of the voltages of the sense nodes, e.g. a value having a linear relationship to a common mode voltage of the voltages of the sense nodes, and a predefined reference voltage, such that the common mode voltage is substantially equal to the predefined reference voltage.

It is an advantage of embodiments of the present invention that the voltage at a fixed location of the plate-shaped element (e.g. in the middle between the sense nodes) can be controlled, without actually enforcing a predefined voltage at any of the contacts, neither grounded nor fixed at any other predetermined voltage. In contrast, in some prior art methods, a voltage is enforced on at least one contact, e.g. on the sense nodes.

It is an advantage of embodiments of the present invention that the plate-shaped sensor element is read out in voltage-mode e.g. by means of a high-impedance measurement device. Hereto, the first sense node and the second sense node are configured as a pair of voltage output terminals. This allows voltages at the output terminals to be sensed with minimal loading, in order to minimize the current associated with the measurement.

At the nodes of the plate-shaped sensor element, the contacts, for instance the sense contacts, have a contact resistance. In current-mode sensing, if the contact resistances at both sense nodes are mismatched, the effects thereof can be visible in the measurement results. In accordance with embodiments of the present invention, however, where voltage-mode readout is applied, both the contact resistance itself, and the mismatch in the contact resistance associated with each node, have only limited influence on the readout signal. For instance in embodiments of the present invention there is much less offset due to such mismatches than in case of current-mode read-out.

It is an advantage of embodiment of the present invention that switches for permutating the connections between the plate-shaped sensor element and the rest of the circuit can be added with a minimal effect on the accuracy. For instance, these switches introduce parasitic resistances in series with the first or the second current source, and in series with the sense nodes. The former has little to no effect on the current level. The latter can be seen as an increase in contact resistance, which as has been described above has little effect when voltage-sensing with minimal loading is used.

Although the sensitivity will still vary with temperature (e.g. due to temperature dependence of the number of free charge carriers in the plate), at least plate thickness variations due to variations of the magnetic field, temperature and piezoresistive stress components are substantially reduced, and because of this, unwanted nonlinear interactions between these are avoided and the cross-sensitivity to piezoresistive stress components is avoided.

Even with a perfect control of the voltage over a PN-junction, some second-order effects still have a small effect on the plate thickness. For instance, the thickness of the PN junction does not only depend on the voltage applied over the junction, but also on other parameters such as the built-in potential. It is known that this built-in potential varies as a function of temperature (e.g. over a few 100 mV in a range of more than 100° C.) and stress. In embodiments of the present invention, these second-order effects may be compensated to arrive at an even more stable plate thickness by making the reference voltage $V_{ref}$ dependent on temperature and/or stress. It is an advantage of embodiments of the present invention, that it can be used for building stress-compensated Hall sensors, with an improved accuracy in terms of linearity.

It is an advantage of embodiments of the present invention that the substrate is connected to a first fixed voltage (e.g. ground), which allows the method to be applied in contemporary CMOS technology.

It is an advantage of embodiments of the present invention that a feedback loop is used for stabilizing the common mode voltage at the plate-shaped sensor element output terminals (sense nodes) without imposing conditions on the differential voltage between these nodes.

In an embodiment of the circuit, e.g. integrated circuit, the negative feedback loop comprises a common mode voltage extraction circuit for generating the common mode voltage, and an amplifier connected via its inputs to an output of the common mode voltage extraction circuit and to the reference voltage. In this embodiment, the second source is a second current source for generating the second current, and an output of the amplifier is connected to a control input of the second source.

In this embodiment, dedicated circuit components can be indicated as the common mode voltage extraction circuit, the amplifier and a second current source. However, in other embodiments, the functions (common mode generation, amplification and current generation) may be distributed or shared functions over several circuit components.

The amplifier is arranged for controlling the second current source as part of a negative feedback loop. The amplifier (circuit) has a sufficient gain, and is arranged as part of a feedback loop so that, in operation, the common mode voltage is substantially equal to the reference voltage, and that the second current is equal to the first predefined current.

It is an advantage of embodiments of the present invention that the common-mode voltage of the output terminals is sensed with circuits which draw little to no current from the readout nodes. This again provides minimal loading to the output terminals, thus minimizing the current associated with the common-mode voltage measurement.

In an embodiment of the circuit, the negative feedback loop comprises a common mode voltage extraction circuit for generating the common mode voltage, and an amplifier connected via its inputs to an output of the common mode voltage extraction circuit and to a reference voltage, and wherein the amplifier is arranged for providing at its output the second current.

In this embodiment, the output of the amplifier itself is used for providing the second current instead of a separate current source dedicated for that task.

In an embodiment of the circuit, the common mode voltage extraction circuit is arranged for determining the common mode voltage by averaging the first and the second voltage.

Circuits, e.g. integrated circuits for averaging two voltages are readily available, and only require a few components (e.g. two transistors). It is an advantage of using the average of the two sense nodes, in that it is a very practical way of "measuring" the voltage at the center of the plate, which is the most important point to control. By keeping the voltage at this point as close as possible to the reference voltage, the linearity of the Hall sensor is increased, and the cross-sensitivity to piezoresisitive stress components is reduced. However, instead of averaging, summing the first and second voltage could also be used.

In an embodiment of the circuit, each of the excitation nodes is connected to exactly one excitation contact of the plate-shaped sensor element, and each of the sense nodes is connected to exactly one sense contact of the plate-shaped sensor element.

Such circuits may have e.g. two excitation nodes and two sensing nodes, thus four contacts on the plate-shaped sensor element.

In an embodiment of the circuit, the plate-shaped sensor element has a shape with a symmetry axis, and the excitation contacts are located on or symmetrically w.r.t. the symmetry-axis; and the sense contacts are located symmetrically w.r.t. the symmetry-axis.

In an example (e.g. the plate-shaped sensor element being a horizontal Hall plate), the plate has two excitation contacts located on the symmetry-axis, and two sense contacts located at opposite sides and at a distance from the symmetry-axis.

In an example (e.g. the plate-shaped sensor element being a vertical Hall plate), the plate may have one excitation contact on the symmetry-axis, and two excitation contacts at a first distance from the symmetry-axis, and two sense contacts at a second distance from the symmetry-axis.

This has the advantage that, when a current is flowing through the plate between the excitation nodes, and in the absence of a magnetic field, the sense contacts are located on an equipotential line, and thus the Hall voltage generated over the sense nodes is equal to zero.

In an embodiment, the circuit, e.g. integrated circuit, furthermore comprises a shielding area, and the plate-shaped sensor element can be electrically isolated from the shielding area by means of a second PN-junction, the shielding area being connectable to a second fixed voltage (fixed wrt. the first voltage).

In yet alternative embodiments, the circuit may comprise additional shielding areas, and the plate-shaped sensor element can be electrically isolated from each of the shielding areas, for instance by means of additional PN-junctions. Each of the shielding areas is connectable to voltages which are fixed with respect to the first voltage. Every shielding area can have its own voltage. In practice, these voltages may be different from one another, but all fixed with respect to the first voltage; or all voltages may be equal to one another Thus, in these embodiments, the voltage difference between each of the one or more second shielding areas and the substrate or well is constant.

In case of a horizontal Hall plate, the second area can be e.g. a top shield. The voltage of the second area must be fixed, and substantially independent of temperature.

In embodiments of the circuit, one or more of the second fixed voltages may be the same as the first fixed voltage.

For example, the fixed voltage of the substrate or well and the fixed voltage of the second area (e.g. the top shield) can both be ground.

In embodiments of the circuit, the plate-shaped sensor element is a horizontal Hall plate.

In embodiments of the circuit, the plate-shaped sensor element is a vertical Hall plate.

The same advantages described above also apply for a vertical Hall plate, although it may be slightly more difficult to visualize the equipotential lines.

In embodiments of the circuit, the plate-shaped sensor element has a shape selected from the group of a circle, a square, a diamond, a cross, a regular polygon, and a regular star-shape.

By choosing such geometries, the common mode voltage is representative for the voltage at the geometrical center of the plate, and by stabilizing the center voltage, the plate thickness is maximally stabilized.

In an embodiment of the circuit, the second current source comprises a MOSFET transistor for providing the second current. The MOSFET transistor may be arranged for operating in saturation mode when providing the second current.

The MOSFET transistor may be a PMOS transistor. The source of this PMOS transistor could be connected directly to the supply voltage VDD. When a PMOS transistor is operated in saturation mode, the current generated by the transistor is largely independent of the voltage VDS over the transistor, but only dependent on the voltage at its gate VGS. This means that even though the electrical resistance of plate may vary with mechanical stress or temperature or other influences, the current will remain constant.

It is advantageous to use high-impedance sources, in particular two current sources, as this implies a good isolation of the sensing device from the often noisy supply and ground connections.

The MOSFET transistor may also be an NMOS transistor. The source of this NMOS transistor could be connected directly to the ground voltage GND. This offers the same advantages to the circuit as mentioned for a PMOS transistor.

In an embodiment of the circuit, the amplifier is an operational amplifier circuit arranged such that the loop gain of the feedback loop is at least 10, preferably at least 100.

The higher the open-loop gain, the smaller the difference between the common-mode voltage and the reference voltage.

In embodiments of the present invention, the plate-shaped sensor element may be configured to perform Van der Pauw-type measurements. In such configurations, two consecutive nodes, when going over the nodes in an order defined by following the edge of the plate-shaped sensor element, have a same function, e.g. two consecutive nodes are excitation nodes or two consecutive nodes are sense nodes.

When the contacts, and hence the associated nodes, are located at the edge of the plate-shaped sensor element, their order is clearly defined, and neighbouring nodes are nodes adjacent one another when following the edge of the plate-shaped sensor element in a particular direction. When the nodes are not located on the edge of the plate-shaped sensor element, their order needs to be determined. This can be done by shrinking the plate area until all contacts are located on the edge of the plate, which again allows to determine their order when following the so-defined "new edge" of the plate.

In particular embodiments of set-ups for performing Van der Pauw-type measurements, the first and second excitation contacts have a center point and form a first contact pair for supplying a current and the first and second sense contact each have a center point and form a second contact pair for measuring a voltage. A line segment interconnecting the center points of the first and second excitation contacts does not intersect with a line segment interconnecting the center points of the first and second sense contacts.

In an embodiment of the circuit, the first current source is a switchable current source for allowing selection one out of a plurality of predefined currents. The first current source, at any moment in time during use of the circuit, defines the current flowing through the plate-shaped sensor element.

The current value of such a current source may e.g. be programmable by a controller. Such current source may be ideally suited for applying different current levels for calibrating the Hall sensor during production.

In alternative embodiments of the present invention, the first current source may be a variable current source arranged for providing the predefined first current as a current dependent on temperature and/or stress of the plate-shaped sensor element. The first current source may for instance be provided with a temperature and/or stress dependence relationship, which allows the current source to provide a different current level dependent on the temperature and/or the stress on the plate.

In an embodiment, the circuit further comprises means for measuring a voltage difference between the first and second sense node as an indication of the magnetic field component.

In an embodiment, the circuit further comprises switches for permutating the connections between the plate-shaped sensor element and the rest of the circuit.

In a second aspect, the present invention provides a method for biasing a plate-shaped sensor element made of semiconductor material in a circuit, e.g. an integrated circuit, the plate-shaped sensor element having at least a first excitation contact connected to a first excitation node, and at least a second excitation contact connected to a second excitation node, and at least a first sense contact connected to a first sense node and at least a second sense contact connected to a second sense node; the plate-shaped sensor element being electrically isolated from a substrate or well by means of a first PN-junction, the substrate or well being connected to a first fixed voltage; the method comprising the steps of:
  a) applying to the first excitation node a predefined first current generated by a first current source;
  b) applying to the second excitation node a second current generated by a controllable second source;
  c) controlling the second source by means of a negative feedback loop based on a comparison between a value representative for a common mode voltage of the voltages of the sense nodes and a reference voltage, such that the common mode voltage is substantially equal to the reference voltage.

In embodiments of the method, the common mode voltage is generated by averaging the first and the second voltage of the sense nodes.

In a method according to embodiments of the present invention, applying a predefined first current to the first excitation node and applying a second current to the second excitation node comprises applying the first current and the second current to two excitation contacts connected to the corresponding excitation nodes, whereby the excitation nodes are selected on the plate-shaped sensor element such that two consecutive nodes when going over the nodes in an order defined by following the edge of the plate, have a same function (excitation or measurement). When the contacts, and hence the associated nodes, are located at the edge of the plate-shaped sensor element, their order is clearly defined, and neighbouring nodes are nodes adjacent one another when following the edge of the plate-shaped sensor element in a particular direction. When the nodes are not located on the edge of the plate-shaped sensor element, their order needs to be determined. This can be done by shrinking the plate area until all contacts are located on the edge of the plate, which again allows to determine their order when following the so-defined "new edge" of the plate.

In a third aspect, the present invention provides a method for measuring a magnetic field component using a plate-shaped sensor element made of semiconductor material, the method comprising the steps of: a) biasing the plate-shaped sensor element according to a method described above, b) measuring a voltage difference between the first and second sense node, as an indication of the magnetic field component.

In a fourth aspect, the present invention provides a method for measuring stress using a plate-shaped sensor element made of doped semiconductor material. The method comprises the steps of: a) biasing the plate-shaped sensor element according to a method described above, where Two consecutive nodes have a same function when going over the nodes in an order defined by following the edge of the plate. When the contacts, and hence the associated nodes, are located at the edge of the plate-shaped sensor element, their order is clearly defined, and neighbouring nodes are nodes adjacent one another when following the edge of the plate-shaped sensor element in a particular direction. When the nodes are not located on the edge of the plate-shaped sensor element, their order needs to be determined. This can be done by shrinking the plate area until all contacts are located on the edge of the plate, which again allows to determine their order when following the so-defined "new edge" of the plate.

Particular and preferred aspects of the present invention are set out in the accompanying independent and dependent claims. Features from the dependent claims may be combined with features of the independent claims and with features of other dependent claims as appropriate and not merely as explicitly set out in the claims.

The above and other aspects of the invention will be apparent from and elucidated with reference to the embodiment(s) described hereinafter.

BRIEF DESCRIPTION OF THE DRAWINGS

FIG. 1(a) shows an example where an excitation source is applied to two contacts, and an output is sensed over two other contacts. FIG. 1(b) shows an example of current-mode biasing, and FIG. 1(c) shows an example of voltage-mode biasing.

In FIG. 5(a) a large common-mode voltage appears at the amplifier input. In FIG. 5(b) the left sense contact is kept virtually at ground by using an operational amplifier.

FIG. 9(a) uses voltage-buffers and a resistive voltage divider, FIG. 9(b) uses two source-follower buffers, wherein also a circuit is added to compensate the threshold-related voltage drop, and FIG. 9(c) shows a switched-capacitor based circuit for extracting a common-mode-voltage.

Figure 1:
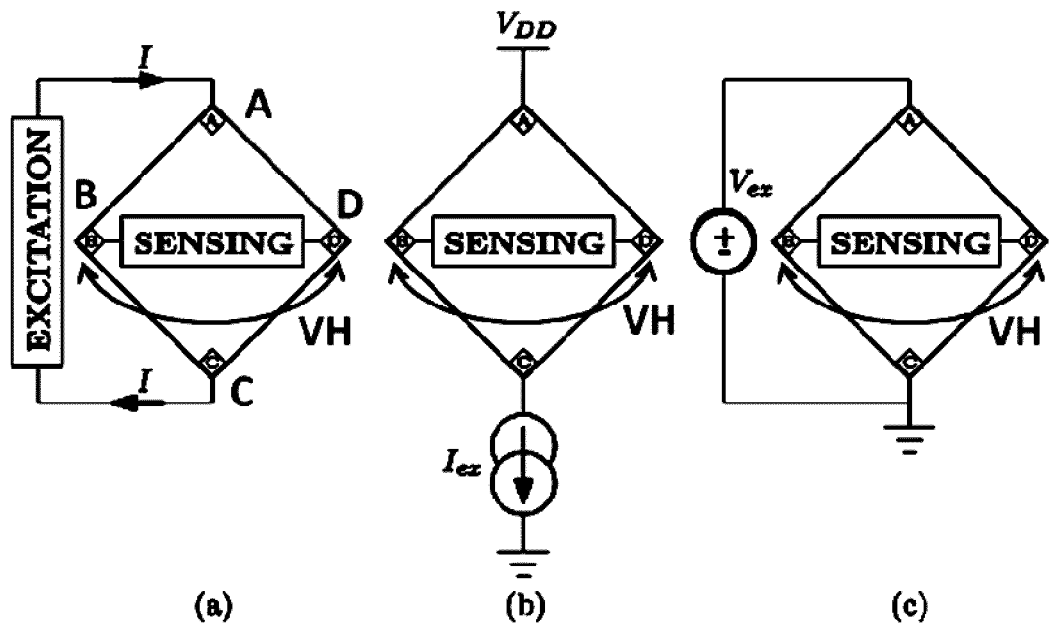
FIG. 1 shows known ways of measuring a Hall-voltage representative for the strength of a magnetic field component.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

When referring to a "Hall sensor" in the context of the present invention, reference is made to a sensor which makes use of the Hall effect when measuring a magnetic field or an electrical current. When an electrical current flows through a Hall sensor which is brought in a magnetic field perpendicular to main current direction, an electrical voltage (Hall voltage) is generated which is substantially proportional to the product of the magnetic field and the current.

In this document, "Hall plate" and "Hall element" are used as synonyms. They refer to a piece of conductive or semiconductive material forming part of the Hall sensor through which the current flows for providing the Hall effect.

A "horizontal Hall element" is a Hall element integrated in a chip, in which current lines are parallel to the chip surface, and which is sensitive to a magnetic field perpendicular to the chip surface.

A "vertical Hall element" is a Hall element integrated in a chip, in which the device region that plays the role of the Hall plate is perpendicular to the chip, and which is sensitive to a magnetic field parallel to the chip surface.

Figure 2:
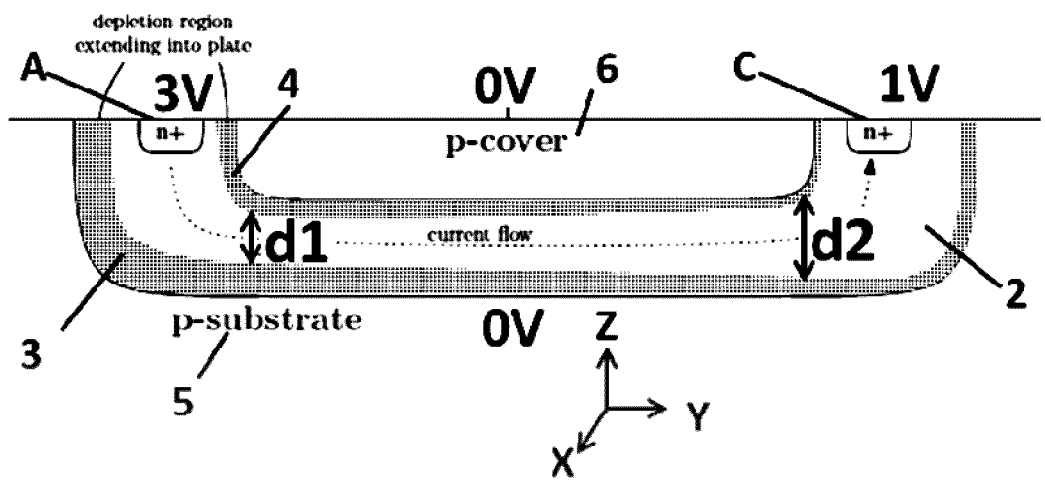
FIG. 2 shows a cross-sectional view of an integrated horizontal Hall plate in accordance with FIG. 1(a), along the diagonal A-C. Depletion-layer variations in a junction-isolated Hall device lead to non-uniform and voltage-dependent plate thickness variations.

When referring to "plate thickness" in the present invention, the thickness of the conductive part of the Hall plate is meant. For example in the horizontal Hall plate of FIG. 2, this means the vertical distance (perpendicular to the chip surface) between the depletion layers. In an embodiment without a top shield, the plate thickness would be the distance between the depletion layer and the chip surface. For the example of a vertical Hall plate of FIG. 16, this means the distance between the depletion layers measured in the y-direction.

When referring to "shield" in the present invention, all material that is of the opposite type as the plate itself and that is directly surrounding the plate is meant. For example in the Hall plate of FIG. 2, the shield is the p-type cover on top of the plate together with the substrate.

When referring to "node" or "electrical node" in the present invention, a part of an electric circuit (e.g. an interconnection) is meant having a single voltage potential.

When referring to "contact" in the present invention, a physical location is meant where an electrical connection to the Hall element is provided. An electrical node may be connected to one or more contacts. In the examples given for horizontal Hall plates, each node is connected to exactly one contact. In the examples given for Vertical Hall plates, some nodes can be connected to two (or more) contacts.

When referring to "Van der Pauw-type measurements", reference is made to a measurement in a plate-shaped device made of doped semiconductor material and having four nodes, each node being associated with at least one contact. The four nodes are divided into two contact pairs, of which one contact pair is used for excitation and the other contact pair is used for measurement. A current is applied to the excitation contacts, and a voltage is measured from the measurement contacts. The set-up is such that, when going over the nodes in an order defined by following the edge of the plate-shaped sensor element, two consecutive nodes can be found which have a same function (excitation or measurement). When the contacts, and hence the associated nodes, are located at the edge of the plate-shaped sensor element, their order is clearly defined, and neighbouring nodes are nodes adjacent one another when following the edge of the plate-shaped sensor element in a particular direction. When the nodes are not located on the edge of the plate-shaped sensor element, their order needs to be determined. This can be done by shrinking the plate area until all contacts are located on the edge of the plate, which again allows to determine their order when following the so-defined "new edge" of the plate.

In particular embodiments, the excitation contacts and measurement contacts are selected on the plate-shaped element such that a line segment interconnecting the center points of the excitation contacts does not intersect with a line segment interconnecting the center points of the measurement contacts.

In the following detailed description, and unless stated otherwise, embodiments referred to related to Hall elements as a particular example of plate-shape elements. This is not, however, intended to be limiting for the present invention.

Figure 3:
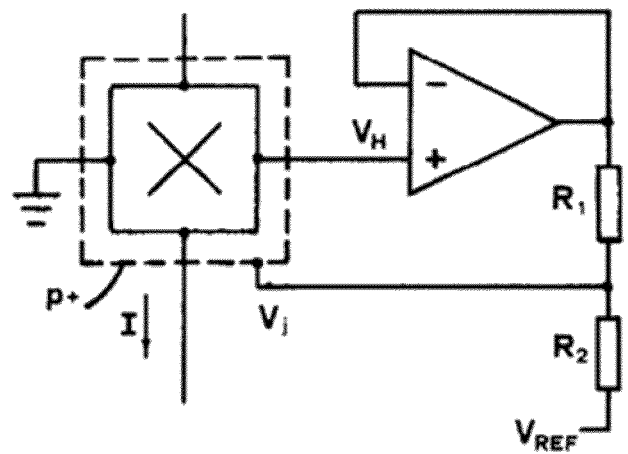
FIG. 3 shows a first prior art circuit proposed for reducing nonlinearity due to the junction effect.
Figure 4:
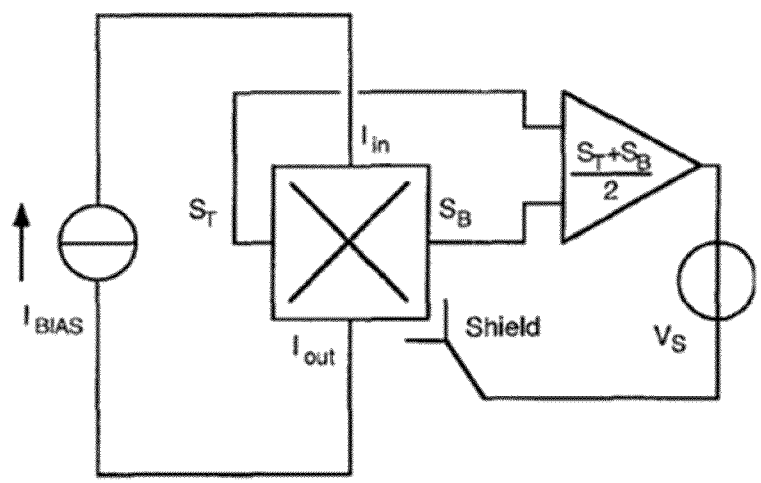
FIG. 4 shows another prior art circuit for reducing nonlinearity due to the junction effect.

FIG. 3 and FIG. 4 show two prior art circuits of a Hall sensor with a shield, whereby the voltage of the shield is controlled by means of a feedback circuit for improving the linearity of the circuit. Unfortunately, this method cannot be used in all contemporary technologies, in particular CMOS technologies, because the voltage of the shield cannot be freely modified at all places, for instance the voltage of the substrate. The circuit of FIG. 5b on the other hand has a limited linearity, a.o. because the (average) plate thickness varies with the Hall voltage. Furthermore, a readout using the circuit of FIG. 5b has typically a higher cross-sensitivity to various stress-components and temperature-effects that cause offset in the Hall element. This is because the (average) plate thickness is affected by the (often large) offset of the Hall device. The circuit of FIG. 5a has the same problems as FIG. 1(b) a.o. nonlinear interactions between temperature and piezoelectric stress effects.

Figure 6:
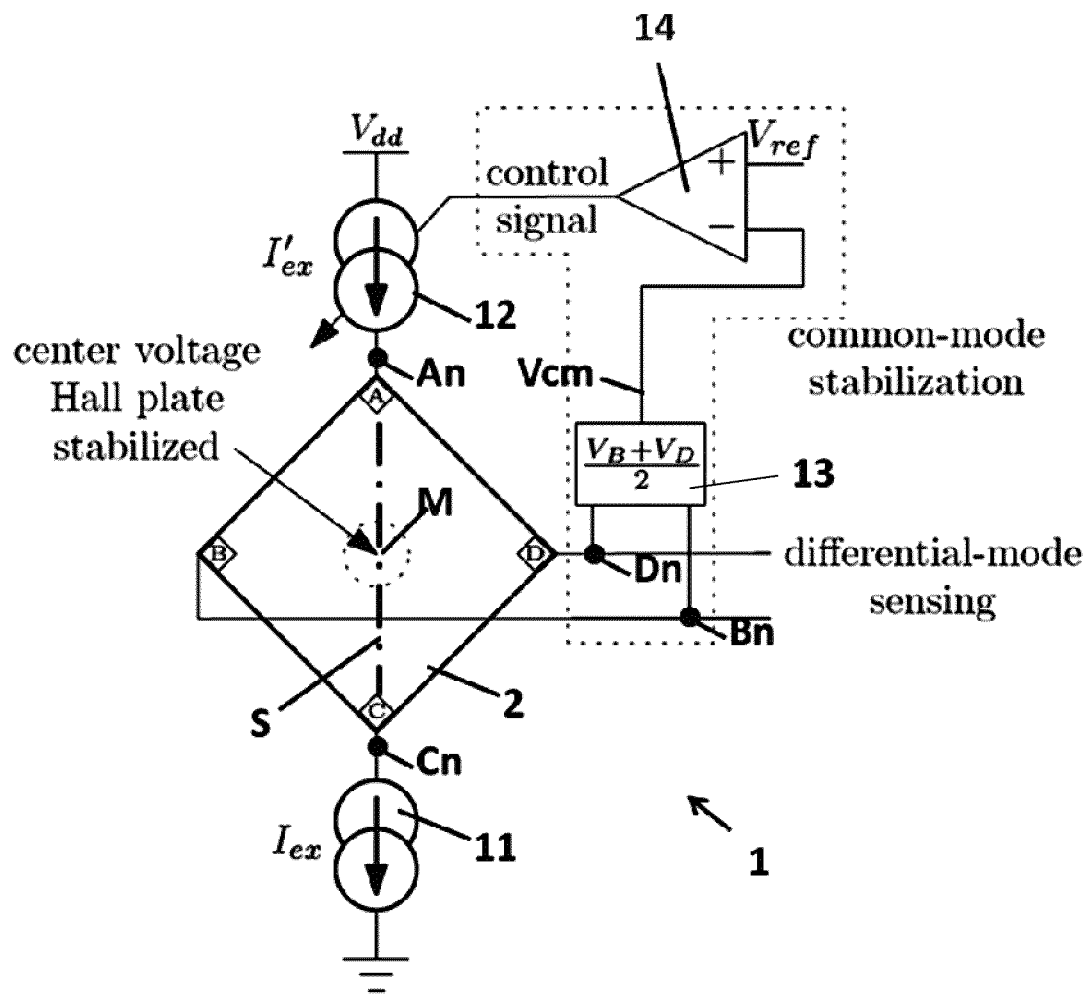
FIG. 6 shows a first embodiment of a circuit according to the present invention, using two current sources.

FIG. 6 shows a schematic block-diagram of an embodiment of a circuit for biasing a horizontal Hall plate, in accordance with aspects of the present invention. The biasing technique allows to stabilize the center-plate voltage (i.e. the voltage at the center M of the plate 2), without applying a fixed voltage to any of the nodes A, B, C, D, and without "contacting" the center M of the plate 2. The substrate and shield are fixed at ground voltage GND, similar to FIG. 2, which is widely applicable in contemporary technologies.

The contacts A, B, C, D are located symmetrically w.r.t. the symmetry-axis S, which in the example of FIG. 6 runs through contacts A and C, and is in the plane of the Hall plate 2. It can be seen in the example illustrated in FIG. 6, but also in some of the other examples, that a Hall element may be used in which, when going along the perimeter of the Hall element, excitation nodes alternate with sensing nodes.

When comparing the circuit of the present invention (FIG. 6) to the prior art circuit of FIG. 1(b), it can be seen that two current sources $I_{ex}$, $I'_{ex}$ are used instead of only one. A first predefined current source 11 defines the current $I_{ex}$ that leaves the Hall plate 2 at the node C. For the purpose of explaining the circuit, this can be considered as a fixed current source. The current value $I_{ex}$ set by this current source 11 accurately defines the bias current that will flow through the Hall plate 2. In contrast to the circuit shown in FIG. 1(b), however, now a second current source 12 is introduced which defines the current $I'_{ex}$ coming from the positive supply VDD and enters the Hall plate 2 at the node A. In order to work in practice, the currents $I_{ex}$ and $I'_{ex}$ need to be the same (in steady state). For this reason, the second current source 12 is adaptable, and will be controlled by means of a negative feedback loop, which among others will have the effect that both current sources 11, 12 will have exactly the same current (in steady state). Referring again to FIG. 6, it can be seen that the Hall plate 2 is connected to the supply voltage VDD and to the ground voltage GND through high-impedance sources, in particular two current sources 11, 12. With "high-impedance" is meant having an impedance higher than 10 kΩ, preferably higher than 100 kΩ. This offers the advantage of providing a good isolation of the sensing device from the often noisy supply VDD and ground connections (as will be explained in more detail in relation to FIG. 11). Because of its high isolation from supply and ground, this biasing approach is referred to as "floating plate biasing".

Next will be described how the feedback loop will stabilize the center-plate voltage $V_{center}$, and at the same time make sure that the current $I'_{ex}$ provided by the second source 12 will be the same (in steady state) as the current $I_{ex}$ provided by the first current source 11. The closed loop comprises:

(i) circuitry 13 that extracts the common-mode voltage $V_{cm}$ of the Hall plate sense nodes B,D, e.g. that determines the average voltage of the sense nodes B,D, (ii) an amplifier 14 which compares the measured common-mode voltage $V_{cm}$ with a predefined reference level $V_{ref}$, amplifies the error signal ($V_{ref}-V_{cm}$) and provides an output signal for controlling the second current source 12, and (iii) the Hall plate 2 itself, through which the currents $I_{ex}$ and $I'_{ex}$ propagate.

In this circuit, $V_{ref}$ is considered as a reference voltage with a stable value relative to the substrate voltage. $V_{ref}$ may be designed to be substantially independent of environmental conditions such as temperature. The reference voltage $V_{ref}$ may for instance be generated by means of a bandgap circuit, which provides a substantially constant voltage, independent of temperature. $V_{ref}$ may also be designed to depend on environmental conditions such as temperature and/or stress in a controlled way, e.g. to compensate for second-order effects that affect the plate thickness even when the voltages would be kept fixed. Many bandgap circuits can be adapted to provide an output voltage with well-controlled temperature-behavior. In general, circuit techniques to obtain stable voltages, possibly with controlled temperature-behavior, are known in the art and need not be further described here. For the purpose of explaining the operation of the feedback loop, it should be kept in mind that every node A, B, C, D of the plate 2 has some parasitic capacitance to ground. Also, the control loop is assumed to be based on negative feedback, and to be stable (so it does not oscillate). The following explanation briefly clarifies the working principle of the feedback-loop. Suppose the circuit is in a state wherein $I'_{ex}=I_{ex}$ and $V_{cm}=V_{ref}$. Suppose now that (for some reason) $I'_{ex}$ is (momentarily slightly) larger than $I_{ex}$. The excess amount of current flowing toward the Hall plate 2 will charge the parasitic capacitances, and the voltages of the Hall plate nodes A to D will increase. As a result, also the common-mode voltage $V_{cm}$ of the sense nodes B and D will increase. The output of the amplifier 14, i.e. the control signal to the second current source will then change in the direction of decreasing $I'_{ex}$ (negative feedback). The reverse situation occurs when $I'_{ex}$ is smaller than $I_{ex}$. Therefore, the feedback loop makes sure that $I'_{ex}=I_{ex}$ (in steady state). Furthermore, it is known from feedback theory that with sufficient loop gain, the error signal in a stable negative feedback loop becomes very small. Here, the error signal is the difference between the measured common-mode voltage $V_{cm}$, which is an accurate estimation of the center-plate voltage at point M, and the reference voltage $V_{ref}$. Hence, the feedback loop manages to stabilize the center-plate voltage $V_{center}$ to a fixed (e.g. temperature compensated) voltage $V_{ref}$. In alternative embodiments, for instance, rather than the common-mode voltage $V_{cm}$, a value representative for the common mode voltage could be used, such as e.g. $2V_{cm}=V_B+V_D$, and this value could be compared with another reference value $V_{ref}'$, for instance equal to $2V_{ref}$. Because also the substrate and shield are tied to fixed voltages (e.g. both to GND), the depletion-layer and thickness at the center M of the plate 2 are kept under constant conditions. This is also the situation if the top shield 6 is tied to another constant voltage relative to ground GND, or even when no top shield 6 is present at all. As a result, also the sensitivity SI of the Hall sensor, which largely depends on the thickness of the Hall plate 2 at the center of the plate, remains more stable by avoiding the non-linear thickness-modulation at the center M of the plate 2, which point M has the highest impact. The feedback circuit according to embodiments of the present invention stabilizes the center-plate voltage by adapting the second current source 12.

In embodiments of the present invention, the influence of the second-order effects (that affect the plate thickness) on the sensitivity can be alleviated by adapting the first current source 11 to make it temperature- and/or stress-dependent in a way that compensates for these temperature and/or stress variations.

In embodiments of the present invention, the reference voltage $V_{ref}$ can be adapted for tuning the sensitivity, independent from the stabilization of the plate thickness at the center of the plate, e.g. to compensate temperature and/or stress effects in the Hall readout, and/or to arrive at a targeted temperature dependency of the sensitivity as a function of temperature.

In an embodiment, the controlled current source 12 can be a single PMOS transistor. An example is the transistor T7 of the circuit of FIG. 11. If the PMOS transistor T7 is operating in saturation, the current I'$_{ex}$ is substantially independent from the supply voltage VDD. Indeed, if the drain-source voltage Vds of T7 is sufficiently large, then the current Ids is only dependent on V$_{GS}$ and not on Vds, and Vd is independent of VDD, or in other words, the voltage of node A is independent of VDD. In practice, making sure that Vds for transistor T7 is sufficiently large to operate in saturation can be achieved by choosing appropriate values for I$_{ex}$ and V$_{ref}$, taking into account the available voltage VDD and the (worst-case) plate resistance. However, the feedback-loop still works satisfactory, even if the transistor behaves as a controlled resistor (i.e. operation in the linear region), which means that the additional voltage headroom for the second source 12 can be reduced, e.g. even kept to a minimum.

Thus, four aspects are used in the biasing method and circuit of FIG. 6. A first aspect is to estimate the center-plate voltage by averaging the voltages of the sense nodes B and D. It is noted that such averaging is a very practical way of measuring the voltage in the center of the plate without actually making contact to the center M of the plate 2, thereby avoiding to influence the measurement. A second aspect is to use current-mode biasing (as opposed to voltage mode biasing), by using a predefined current source 11. In Si-based Hall devices, the cross-sensitivity to temperature is approximately 5 times lower for a current-biased Hall device as compared to a voltage-based Hall-device. A third aspect is the use of a second, dependent current source 12 for generating a current equal to the current of the first predefined current source 11, without imposing the voltage at any point of the plate, except at the center M of the plate. Indeed, the plate voltage is allowed to "float" about a "working point" which is automatically determined by means of a feedback-loop, in which working point, according to aspects of the present invention, the linearity is improved (i.e. the relation between V$_{Hall}$=V$_B$−V$_D$ and the applied magnetic field is more linear). Indirectly also the cross-sensitivity to external factors such as e.g. stress and temperature may be reduced, because the plate thickness is more constant, a.o. substantially independent of the applied magnetic field, and piezoresistive stress components that act on the Hall element. A fourth aspect is to connect the region below the plate 2, and optionally the region 6 above the plate to a constant voltage with respect to ground, e.g. to ground.

Figure 5:
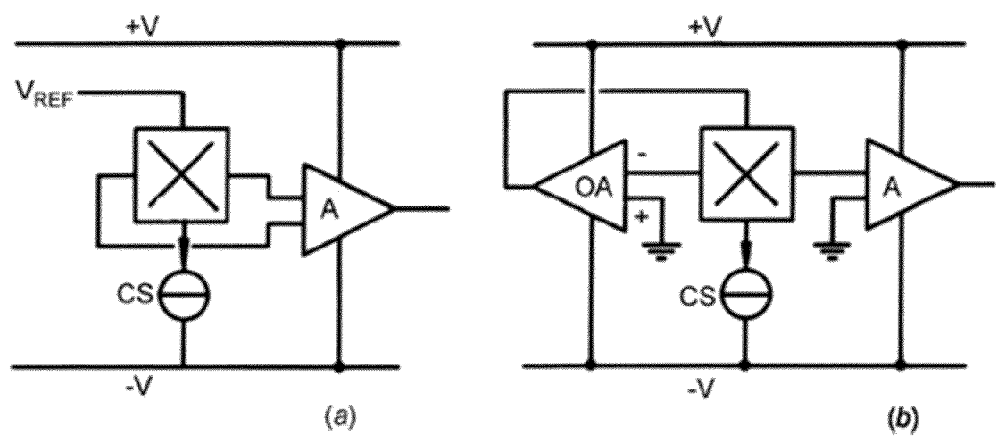
FIG. 5(a) and FIG. 5(b) illustrate two circuits for biasing a Hall device and amplifying its output voltage.

An improvement of the circuit of FIG. 6 over the circuit of FIG. 5(b) is that the plate thickness in FIG. 6 is at the point where it has the biggest impact on the sensitivity independent of the Hall-voltage (thus of the applied magnetic field), hence the improved linearity, whereas the plate thickness of FIG. 5(b) varies at that point with the hall-voltage.

Figure 10:
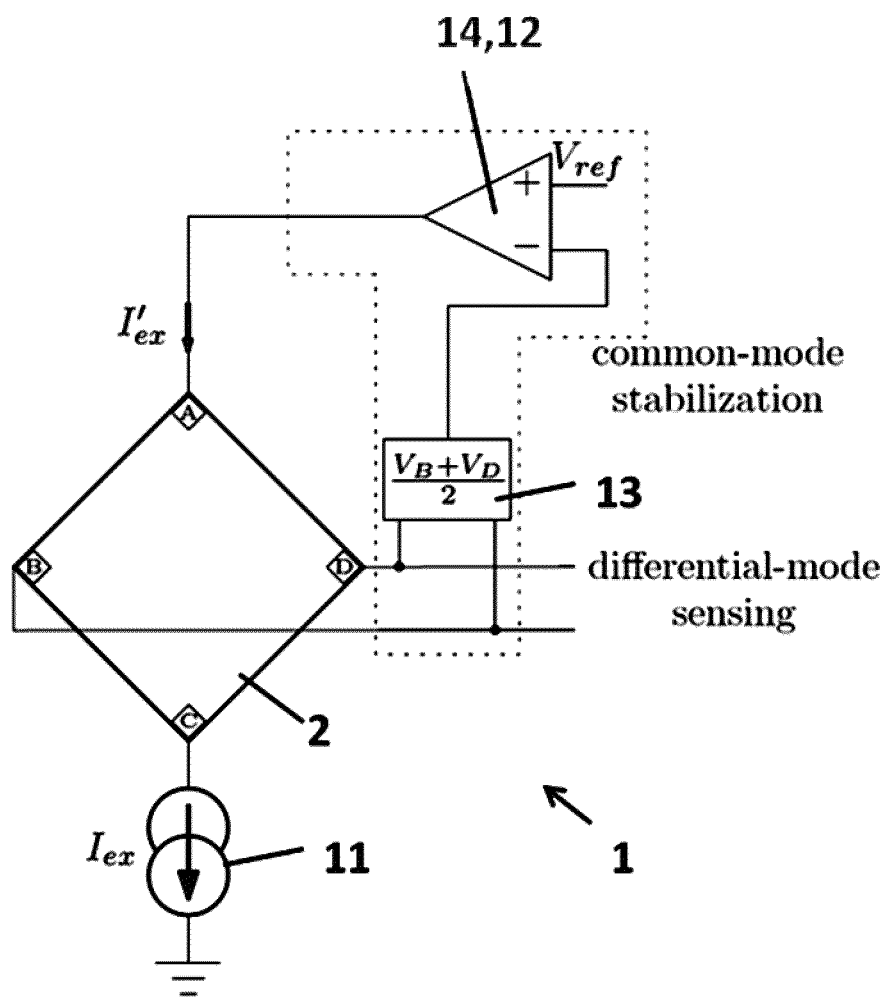
FIG. 10 shows another embodiment of a circuit according to the present invention, using a generic amplifier, e.g. an operational amplifier for delivering the second current to the Hall plate.

Whereas the circuit of FIG. 6 has a current source 12 as the dependent source, in an alternative embodiment of the present invention, the second source 12 may also be a dependent voltage source, for instance the output-voltage of the amplifier 14 (FIG. 10). The principle works as long as the feedback loop is stable and has a sufficient loop gain to make the error signal (V$_{cm}$−V$_{ref}$) sufficiently small.

Theoretical Considerations

It will now be explained that the sensitivity of the Hall plate 2 is mainly determined by the plate thickness dm at the center M of the plate 2, which thickness dm in turn depends on the voltage V$_{center}$ at that location. This will first be explained for horizontal Hall plates.

There are two mechanisms to consider which have an influence on the voltage at each location of the plate 2. The first one is associated with the resistive voltage drop in the direction of current flow (from contact A to C), which is in the order of one or several Volts, e.g. about 2.0 V. The second one is the change in voltage due to the Hall effect. The latter effect is typically much smaller than the former, with voltages induced by the Hall effect in the order of mV. Therefore, the present analysis will initially focus on the resistive voltage drop, neglecting for the time being the superimposed Hall voltage. Later on, the effects of the superimposed Hall voltage will be considered.

Figure 7:
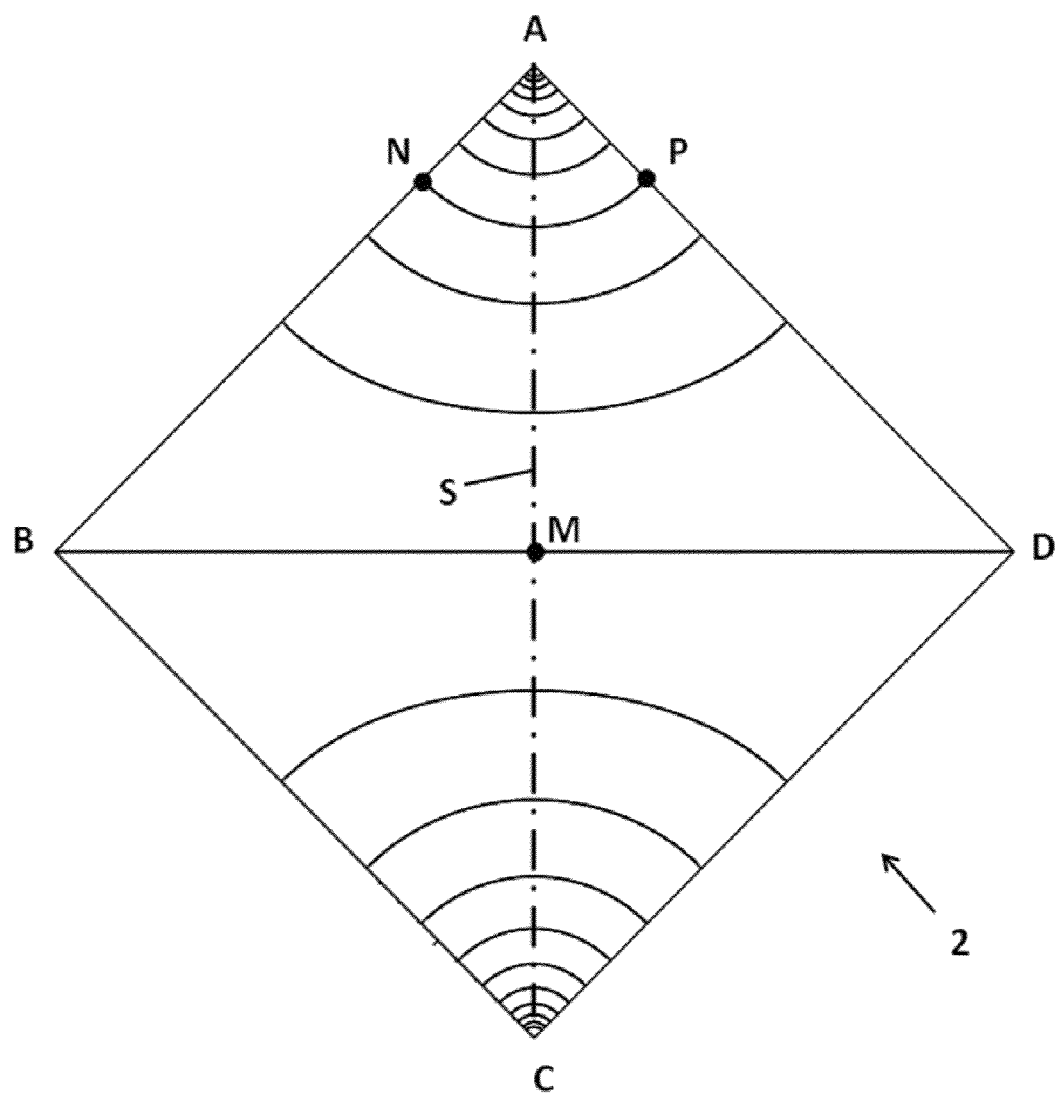
FIG. 7 shows equipotential lines of a square Hall plate with uniform thickness in the absence of a magnetic field. The current streamlines (not shown) are orthogonal to the equipotential lines.

In order to study the resistive voltage drop (from point A to point C), first a uniform plate thickness is assumed. FIG. 7 shows equipotential lines of a square Hall plate with uniform thickness, in the absence of a magnetic field (i.e. assuming Bz in a direction perpendicular to the plate=0). The equipotential lines are orthogonal to the current streamlines (not shown) flowing from contact A to contact C. FIG. 7 shows how the voltage changes over the plate in case of a square plate 2 with contacts A,B,C,D in the corners of the plate 2. In this example, current enters the plate at contact A in one corner (at a high voltage, e.g. about 3.0 V), and leaves at contact C in the opposite corner (at a low voltage, e.g. about 1.0 V). The sense contacts B and D are located on the left and right corners of the figure, and are located on an equipotential line (in the absence of a magnetic field). This square-plate geometry with contacts in the corners will be used most of the time in the present discussions, but other symmetrical geometries, such as e.g. a circle or diamond or cross shape or regular polygons may be used as well.

The assumption of a uniform plate thickness is clearly not correct, as this leads to a contradiction. Indeed, when assuming a uniform plate, it can be seen from FIG. 7 that the voltage (indicated by the equipotential lines) varies over the plate 2, e.g. between the points A and C, which implies that the plate thickness cannot be uniform. While at first sight the interaction seems to make the physical problem difficult to analyze, it can be shown that an important characteristic of the real voltage distribution remains: the equipotential lines that are derived for a plate of uniform thickness, remain also equipotential lines when voltage-dependent changes in conductivity occur. A voltage-dependent change in thickness can be viewed (approximately) as a voltage-dependent change in the local conductivity of the plate. The main distinction between the two situations (with or without depletion effects) is then that the voltage associated with an equipotential line assumes different values. In other words, the shape of the equipotential lines, for instance the curved path PN indicated in FIG. 7, does not alter (under some idealizing conditions). But the actual voltage corresponding with this path does depend on the characteristics of the voltage-dependent thickness variations.

The situation when a magnetic field Bz is applied perpendicular to the plane of the plate 2 is now considered, and a calculation is made by how much the voltage difference between the points B and D changes. Because the sense contacts B, D are at these locations, this is the Hall voltage VH. For the purpose of calculating VH, the transverse electric field EH produced by the magnetic field Bz needs to be integrated. Integration will be done along the sense line B-D, which is according to FIG. 7 an equipotential line (if no magnetic field is applied). As a result, at least for low magnetic fields, the integration path is orthogonal to the current stream-lines (not shown). Also for higher magnetic fields, the main current flow is orthogonal to the sense line.

Figure 8:
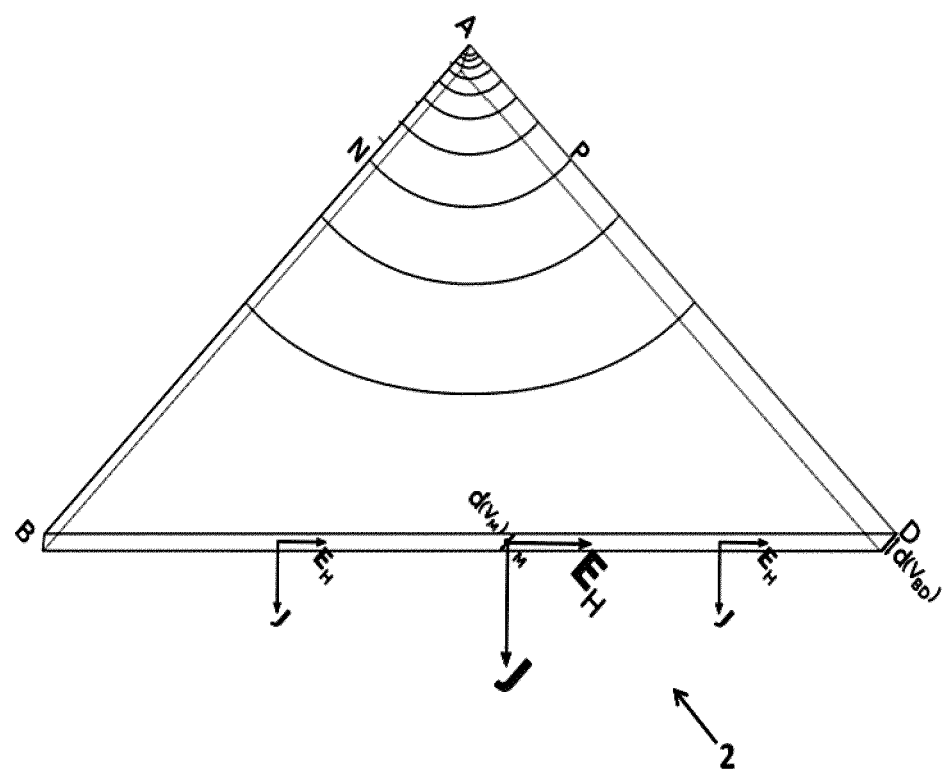
FIG. 8 shows a section of the plate of FIG. 7 cut along the path BD.

When now cutting the plate 2 of FIG. 7 along the path BD, the situation depicted in FIG. 8 is obtained. It is known that the path BD is no longer an equipotential line in the presence of the magnetic field Bz, because of the generated Hall voltage VH between points B and D. A linear change of the voltage along the sense line BD is now assumed. Because typically the Hall effect is rather weak, this approximation is quite accurate. If the center plate voltage is denoted by $V_{center}$, then the voltage varies from $V_{center}-VH/2$ at the first sense contact B to $V_{center}+VH/2$ at the second sense contact D. The voltage varies then over the sense line BD according to the following formula:

$$V(s) = V_{center} + \frac{V_H}{2}s \text{ with } s \in [-1, +1] \quad (1)$$

As a result of the change in voltage, the thickness along the cross-section will also vary. This change of thickness corresponds with d(V(s)), and can, again with good approximation, be considered as a linear variation:

$$d(V(s)) \approx d(V_{center}) + d'(V_{center})\frac{V_H}{2}s \quad (2)$$

In this, d' represents the derivative of the thickness with respect to voltage, and hence $d'(V_{center})$ is a measure of how much the plate-thickness changes under perturbation of the center-plate voltage.

An expression for the Hall voltage is now determined. As already mentioned, for this purpose, the transversal Hall electric field is integrated along the sense line B-D. Following the derivation in L. J. Van der Pauw, "A method of measuring the resistivity and Hall coefficient on lamellae of arbitrary shape", Philips Technical Review, Vol. 20, pp. 220-224, 1958, the transversal Hall electric field can be determined as:

$$E_H = \frac{1}{nq}JB_z \quad (3)$$

in which EH represents the electrical field, n represents the density of free electrons in the active region of the plate, q represents the unit charge of an electron, and J is the current density of the excitation current. In the present analysis, n will be assumed to be constant. Then, the main variation of EH along the sense line comes from the changing current density J. Indeed, the current density J goes from zero at one sense contact, to a high value in the center of the plate, and then back to zero at the other sense contact. The Hall voltage can now be calculated as the integral of EH along the sense line:

$$V_H = \int_{-1}^{+1} E_H(s)ds = \frac{B_z}{nq}\int_{-1}^{+1} J(s)ds \quad (4)$$

in which J(s) represent the current density along the sense line. In order to proceed, an estimate of the integral of J along the sense path is required. This is derived as follows. It is known that the total current flux passing through the cross-section is equal to the bias current I of the Hall plate. Taking into account that both the current density J and the plate thickness d change along the sense line, the total current needs to be obtained by integration along the sense path, leading to:

$$\int_{-1}^{+1} d(V(s))J(s)ds = I \quad (5)$$

Introducing in this the approximation (2), and dividing by $d(V_{center})$ leads to:

$$\int_{-1}^{+1} J(s)ds + \frac{d'(V_{center})}{d(V_{center})}\frac{V_H}{2}\int_{-1}^{+1} sJ(s)ds = \frac{I}{d(V_{center})} \quad (6)$$

Using again the linear approximation (2), an alternative expression for the coefficient appearing before the second integral can be derived:

$$\frac{d'(V_{center})}{d(V_{center})}\frac{V_H}{2} \approx \frac{d(V_D) - d(V_B)}{d(V_D) + d(V_B)}$$

This can be interpreted as a relative measure of how much the thicknesses at the two sense contacts B, D differ. The corresponding value can be expected to be much smaller than one. Furthermore, the second integral in (6) is much smaller than the first integral. There are two reasons. First, the current density J(s) is to a large extend even along the sense line. In the limiting case of negligibly small Hall voltages, the symmetry is perfect, and the second integral is perfectly zero. Since deviations only occur when the Hall voltage is present, it can be considered a small effect. Second, by comparing integrands, it can be seen that in the region where J(s) becomes large, i.e. near the center, s becomes small. Therefore, as the integrand s.J(s) is never larger than J(s), and is even substantially smaller in the middle, the second integral is always much smaller than the first. Based on all these elements, it can be concluded that the second term in (6) is negligible compared to the first one, and the following is obtained with good accuracy:

$$\int_{-1}^{+1} J(s)ds = \frac{I}{d(V_{center})}$$

With this, expression (4) for the Hall voltage can be rewritten as $$V_H = \frac{B_z}{nq}\frac{I}{d(V_{center})} \quad (7)$$

This expression for the Hall voltage can now be related to the current-related sensitivity SI which is defined by the relation:

$$S_I = \frac{V_H}{I \cdot B_z} \quad (7b)$$

The obtained expression for the current-related sensitivity is then:

$$S_I = \frac{1}{nq} \frac{1}{d(V_{center})} \tag{8}$$

The current-related sensitivity depends therefore mainly on the thickness of the plate at the center. This, on its turn, is mainly determined by the voltage of the plate relative to the substrate and other parts of the shield (if present). It is to be noted that, due to the depletion-layer effect, the voltage $V_{center}$ cannot be derived directly from the applied voltages. For a uniform plate (i.e. with no depletion-effects) with the symmetrical shape as shown in FIG. 6, $V_{center}$ would be at the midpoint of the excitation voltages V(A) and V(C), for reasons of symmetry. However, with the depletion effect, the resistivity of the plate increases with voltage, which translates into $V_{center}<[V(A)+V(C)]/2$. The actual value depends on how the plate thickness d changes with voltage, i.e. the whole d(V) characteristic.

The current-related sensitivity SI (as given by equation 8) is derived for an idealized Hall device having point-like contacts on the edge of the device. In reality, the contacts have finite sizes. It is known that in this case the contacts create short-circuit effects, leading to some loss of sensitivity, as described by R. S. Popovic in "Hall Effect Devices, Second Edition", Taylor & Francis, ISBN 9780750308557. Because such effects also occur in uniform plates, the analysis done on uniform plates can be used as an approximation. The current-related Hall sensitivity of a uniform N-type plate is, as described in the same publication:

$$S_I = G_S \frac{r_H}{nqd} \tag{9}$$

This is a well known formula. In this, a geometry-factor Gs appears, accounting for the effects due to plate geometry, contact size and placement, and a factor rH which is called the Hall scattering factor. While these factors are derived for a uniform plate 2, they are independent of the actual plate thickness. Furthermore, the Hall device geometry is mostly chosen to minimize the loss due to short-circuit effects. These short-circuit effects are therefore fairly localized phenomena, affecting mostly the current flow in the neighborhood of the contacts. But near the contacts, especially the sense contacts, the voltage is fairly constant, which implies that also the plate thickness is fairly uniform there. Because the loss factor Gs does not depend on the actual plate thickness, more-or-less the same loss-factor will apply when depletion-layer effects occur. Therefore, the same factors that include the depletion-layer effect can be introduced in the analysis. This leads to the basic result underlying the present invention:

$$S_I = \frac{G_S r_H}{nq} \frac{1}{d(V_{center}, \varphi_{bi}(T, stress))} \tag{10}$$

Stated in words, it has been demonstrated (by theoretical considerations) that the sensitivity of the Hall plate is mainly determined by the thickness at the center of the plate, which on its turn depends mostly on the voltage at this location. However, also the built-in potential $\varphi_{bi}$, which varies as a function of temperature and/or stress, has an effect on the plate thickness (hence also on the sensitivity).

Equation (10) is an important result to understand how the depletion layer effect can affect the linearity of a Hall device. A possible mechanism is that $V_{center}$ depends on the Hall voltage VH. In such a case, the sensitivity changes with the Hall voltage, which clearly affects the linearity of the magnetic sensor. However, if the center voltage is kept constant (e.g. equal to $V_{ref}$), then the sensitivity SI is substantially independent of the applied magnetic field, which is an important advantage of the present invention. For basically the same reason, the sensitivity is not affected by the possibly large offset that the Hall plate might have.

Also for other plate geometries (e.g. square shape with contacts in the middle of the sides, cross-shaped plate, etc.) it is possible to define a point at which the voltage with respect to the substrate (and other shielding parts, if present) matters the most for the sensitivity. Indeed, the same kind of reasoning as above can be repeated for these geometries. The two main requirements for choosing the location of the sensing points B, D are: (i) the sense contacts need to be placed on an equipotential line (when Bz=0), and (ii) the geometry provides sufficient symmetry to show that the current density distributes evenly along the sense path (also when Bz=0). With "evenly" is meant according to an even function, which means that values on the left of the origin (here: center) are equal to values on the right of the origin (here: center). Such sensing locations B,D may also be found for a vertical Hall element. Then, the middle of the sense line can also be considered to be the most important one with respect to voltage-dependent thickness modulation effects.

Other biasing approaches, such as the ones shown in FIG. 1(b) and FIG. 1(c) have some important problems, which makes them inferior to the solutions with stable center-plate voltage. In FIG. 1(b), the center-plate voltage varies with effects that change the resistivity of the plate, such as temperature and (mechanical) stress. Because the effective plate-thickness is modulated—even in a nonlinear way—by temperature and stress, the sensitivity SI will show important cross-sensitivities to these effects. The nonlinear interaction is especially problematic when the Hall readout systems needs to include temperature and stress-compensation, as is the case in newly developed advanced Hall readout. Cross-sensitivities to temperature and stress also appear with voltage biasing, such as with FIG. 1(c), but this requires some additional steps to demonstrate. First of all, the voltage-related sensitivity SV and current-related sensitivity SI are connected through the relation $SV=SI/R_{plate}$. In this, $R_{plate}$ is the resistance of the plate as measured by applying the exact voltages used in the biasing approach, measuring the current that the voltage sources have to deliver, and extract from this the resistance. With voltage-biasing, one has the advantage that the center-plate voltage remains stable when uniform changes in resistance occur. This is for instance the case with temperature and some stress-effects. However, the resistivity $R_{plate}$ of the plate is strongly influenced by temperature, stress, and the overall depletion-layer effects. Therefore, the voltage-related sensitivity does have a strong cross-sensitivity to the mentioned environmental conditions, and also here the different environmental conditions interact in a nonlinear way, making it difficult to provide effective compensation for their effects.

Detailed Circuits

Figure 9:
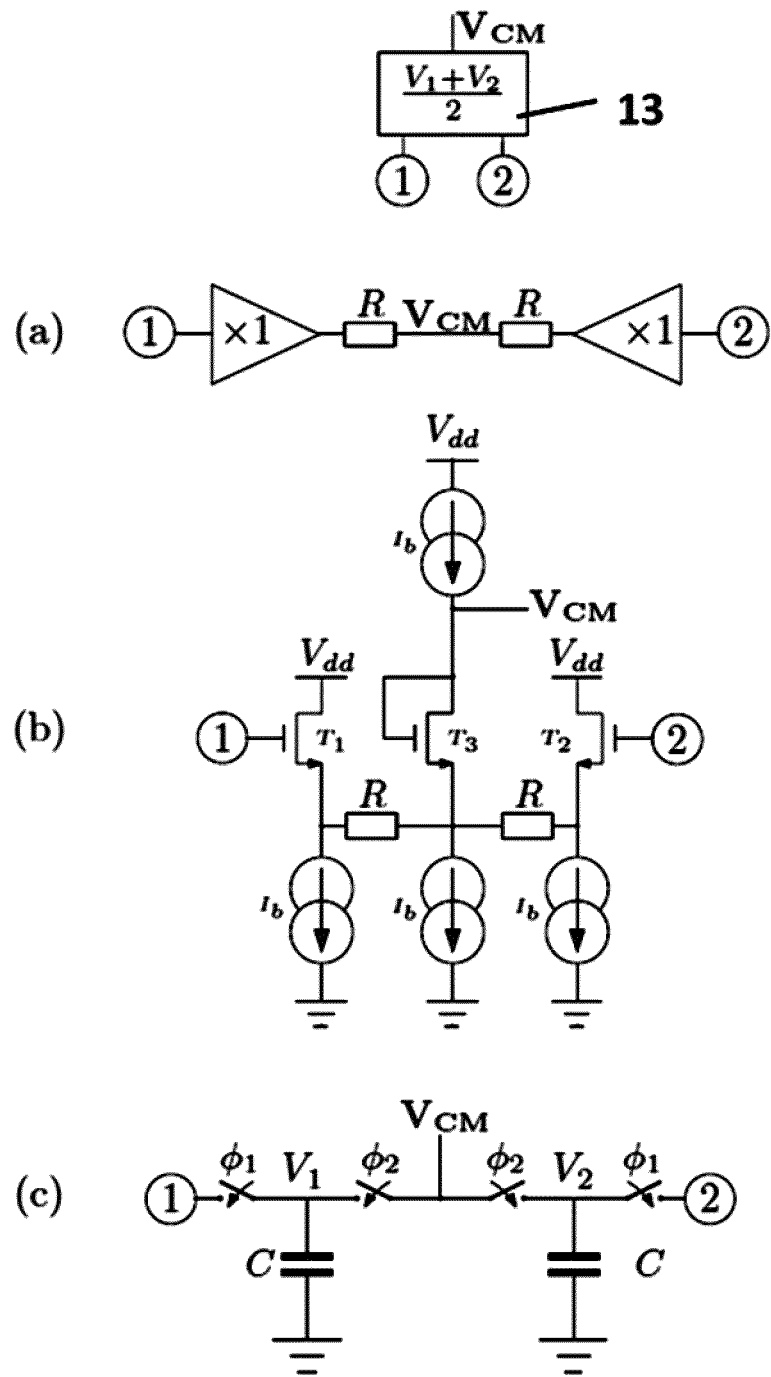
FIG. 9 shows examples of circuits for extracting a common-mode voltage.

FIG. 9 shows some ways to extract a common mode voltage $V_{cm}$ from two voltages $V_1, V_2$, as known by people skilled in the art of integrated circuit design; however, other sub-circuits may also be used.

A first class of approaches, shown in FIG. 9(a), operates in continuous time. It is well known that the average voltage (i.e. the common-mode voltage) can be determined by two nominally equal resistors. When the resistors would be connected directly to the Hall sense nodes, they would draw a current and thus interfere with the Hall readout. Therefore, voltage-buffers are added to avoid the loading effect of the resistive divider.

An easy way to implement a voltage-buffer is a simple source-follower, leading to the circuit shown in FIG. 9(b), in which $T_1$ and $T_2$ are the transistors that are in source-follower configuration. However, the source-followers introduce a voltage drop $V_{GS}$, which depends on the bias current-level through the transistor, the temperature, etc. It can then be beneficial to add a matched $V_{GS}$ back to the extracted common-mode level. A possible implementation is also shown in FIG. 9(b), where use is made of a diode-connected transistor $T_3$ with a bias current matched to the one flowing through the buffer transistors ($T_1$ and $T_2$).

A second class of circuits for extracting the common-model level operates in discrete time, and involves sampling operations. These techniques are often based on switched capacitors, as this is easy to integrate in CMOS technology. A simple circuit is shown in FIG. 9(c). In this circuit, two non-overlapping clock signals θ1 and θ2 are used. When θ1 is active (switches driven by it are closed, while others are open), both input voltage are sampled on separate but nominally equal capacitors. When θ2 becomes active, the two capacitors are connected, and after charge redistribution the voltage over the capacitors corresponds with the average.

FIG. 10 to FIG. 14 show several detailed circuit diagrams as embodiment of circuits according to the present invention, but the invention is not limited thereto.

Whereas the circuit of FIG. 6 comprises a second current source for generating the second current $I'_{ex}$, the second current may also be generated in other ways. The circuit of FIG. 10 uses an amplifier, e.g. an operational amplifier 14 for delivering the current $I'_{ex}$ to the Hall plate 2. The adaptable (second) current source 12 can be considered as part of the amplifier 14, which amplifier 14 can be chosen from a large variety of possible integrated amplifier architectures. Preferably the amplifier has a high output impedance (e.g. based on a PMOS transistor in saturation mode). But the amplifier may also have a low-impedance (e.g. about 1 kΩ or lower) voltage output (e.g. when the amplifier has an output stage for voltage buffering). However, it is clear that the amplifier 14, 12 always has to source current $I'_{ex}$ toward the plate 2, and this current comes from the positive power supply VDD. The higher the output impedance of the device that delivers the second current $I'_{ex}$, the more is the Hall plate isolated from the supply voltage VDD, and thus the less sensitive to ripple or disturbances of the supply voltage.

Out of the vast amount of possible realizations, some circuits will be described in more detail. An embodiment of the circuit is shown in FIG. 11.

In order to bias the plate, a current $I_b$ is used which may come from a master bias circuit on the chip, as is commonly done in chip design, but a local current generator may also be used. The current $I_b$ (and therefore also $I_{ex}$ which is derived from it) may be temperature compensated, but that is not absolutely required. The current $I_b$ may also come from a circuit that changes the current level in accordance with temperature and/or stress (e.g. for the purpose of compensating the effects of these environmental conditions on the final magnetic readout of the Hall sensor).

The current mirror $T_1$ & $T_2$ scales this bias current $I_b$ to a value that determines the excitation current $I_{ex}$. The current mirror $T_1$ & $T_3$, where T3 is taken as twice the strength of $T_2$, sets the current of the tail source of the differential pair $T_4$ & $T_5$ to 2 $I_{ex}$. When $V_{cm}=V_{ref}$, half of the tail current, i.e. $I_{ex}$ flows through $T_6$. This current is mirrored to $T_7$ to determine the current level $I'_{ex}$. It is then clear that with ideal mirrors, $I'_{ex}=I_{ex}$ when $V_{cm}=V_{ref}$. It is noted that negative feedback is involved. For instance, when $V_{cm}<V_{ref}$, the current in $T_6$ will increase, which through the mirror operation of $T_6$ & $T_7$ increases $I'_{ex}$, which leads to an increase of the Hall sensor node voltages. The dotted lines indicate blocks corresponding with the block-diagram of FIG. 6. The block 13 for extracting (or estimating) the common-mode voltage $V_{cm}$ is isolated from the rest of the circuit, the amplifier 14 is formed by $T_3$, $T_4$, $T_5$, $T_6$, $T_8$, and $T_7$ plays the role of the second (adaptable) current source 12.

Figure 11:
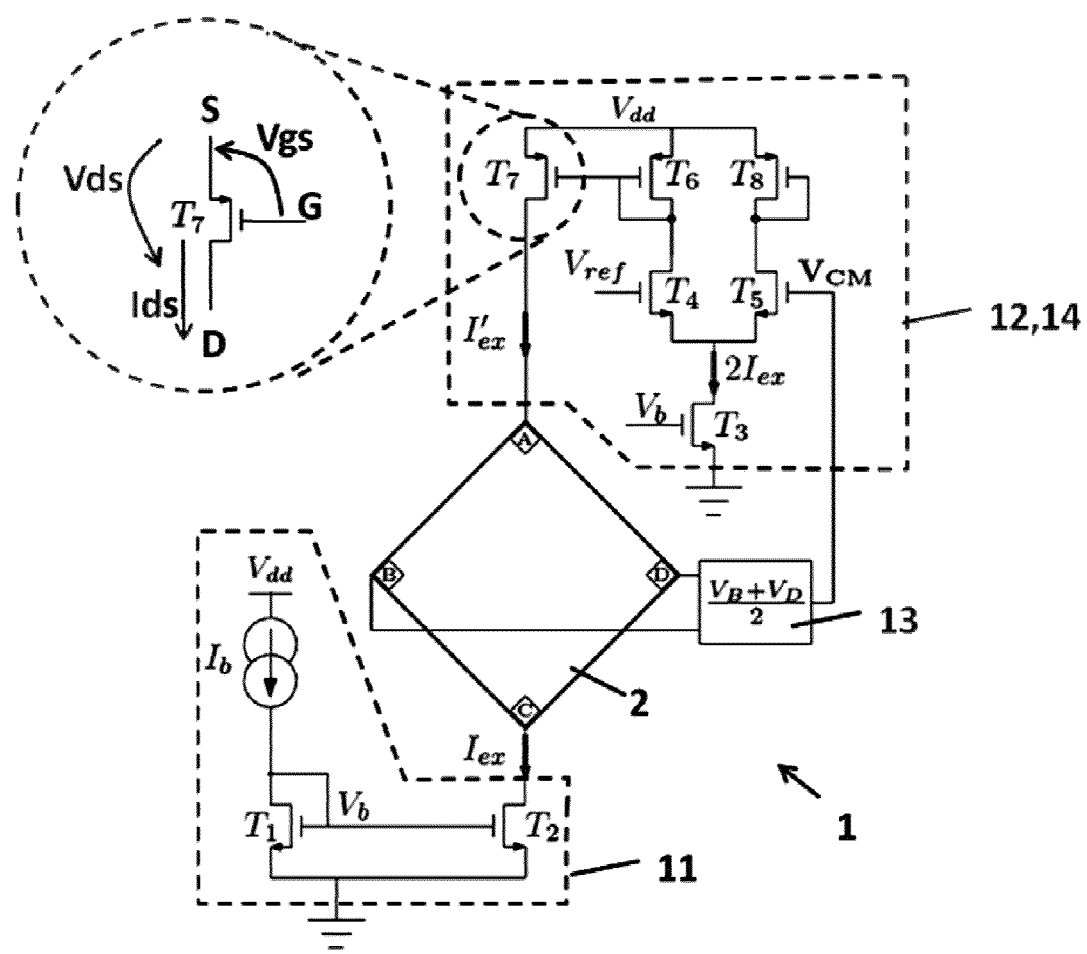
FIG. 11 shows a detailed implementation of a circuit according to embodiments of the present invention.
Figure 12:
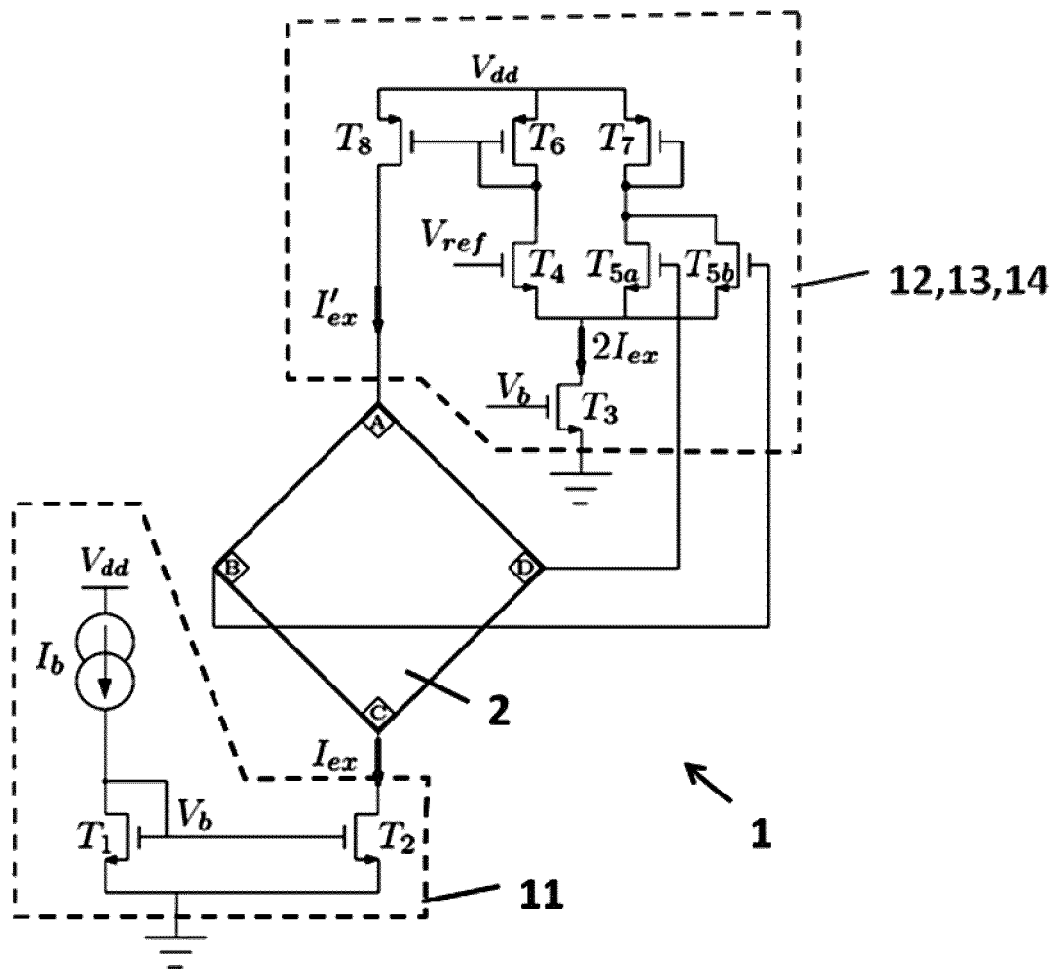
FIG. 12 shows a variant of the circuit of FIG. 11.

FIG. 12 shows a variant of the circuit of FIG. 11, where the transistor T5 is split into two equal parts, denoted as T5a and T5b, which are driven directly with the sense node voltages VB and VD. Now the block 13 for generating the common-mode voltage (or average) is not a separate block anymore, but is implicitly present in the differential pair. Indeed, the differential output current $\Delta i_{out}$ of the differential pair can be shown to be $$\Delta i_{out} = g_m \left( \frac{V_B + V_D}{2} - V_{ref} \right)$$

in which $g_m$ denotes the transconductance of T4 (hence T5a and T5b both have transconductance $g_m/2$ because they are half the size of T4). From the above formula, the implicit comparison of the common-mode voltage $$\frac{V_B + V_D}{2}$$

of the sense node voltages $V_B$ and $V_D$ with the reference voltage $V_{ref}$ becomes clear. The functional behavior of the circuit in FIG. 12 is then the same as of FIG. 11, where the common-mode voltage is generated explicitly and compared with $V_{ref}$ in the differential pair. When the transconductance $g_m$ is chosen the same in FIG. 11 and FIG. 12, the same gain is provided by the differential pair. Therefore, In both cases, the differential pair is involved in amplifying the error signal of the feedback loop.

Figure 13:
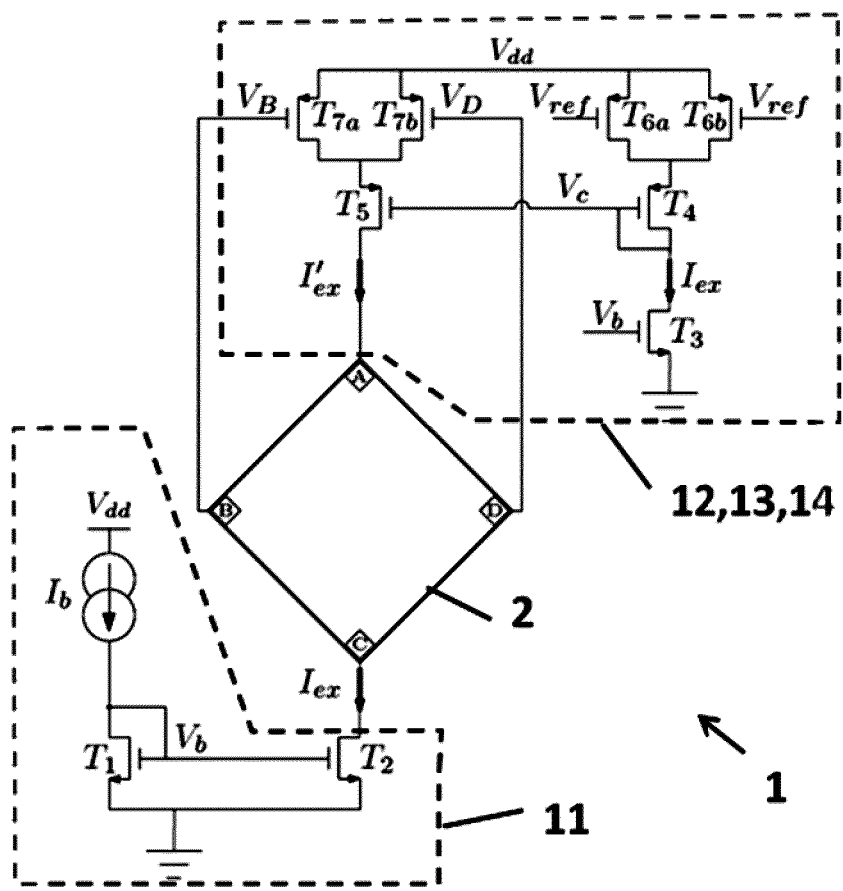
FIG. 13 shows another detailed implementation of a circuit according to embodiments of the present invention.
Figure 14:
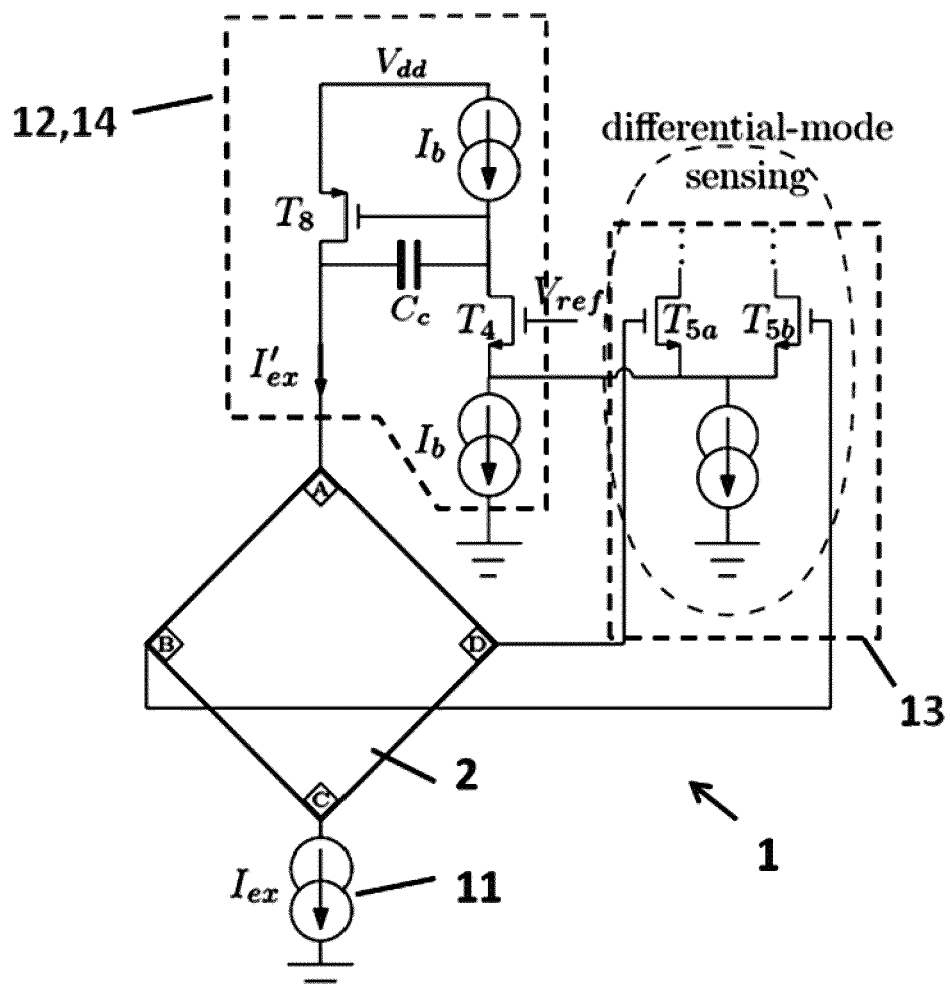
FIG. 14 shows another detailed implementation of a circuit according to embodiments of the present invention.

FIG. 13 shows another embodiment, where a further integration of common-mode voltage extraction, error amplification and feedback current setting can be found.

The circuit uses four nominally equal transistors: $T_{6a}$, $T_{6b}$, $T_{7a}$, and $T_{7b}$. These transistors are operated in their linear region, which requires the drain-to-source voltage to be small. This drain-to-source voltage is determined by the biasing circuit on the right side, consisting of $T_3$, $T_4$ and the pair $T_{6a}$ & $T_{6b}$. $T_3$ is used to set the current level in the bias circuit to $I_{ex}$. The gates of $T_{6a}$ and $T_{6b}$ are tied to the fixed voltage $V_{ref}$, and the gate voltage $V_c$ of the diode-connected $T_4$ settles to a value that sets the drain-to-source voltage of the triode transistors $T_{6a}$ and $T_{6b}$ to match the current $I_{ex}$. The same voltage $V_c$ is now also applied to $T_5$, and because in regime the current $I'_{ex}$ through $T_5$ will be the same as the current $I_{ex}$ through $T_4$, the source voltages of $T_4$ and $T_5$ will then be the same. Therefore, the pair $T_{7a}$ & $T_{7b}$ will have the same drain-to-source voltage as $T_{6a}/T_{6b}$. Assuming now that $V_B=V_D=V_{ref}$, it can be seen that $T_5$ and $T_{7a}/T_{7b}$ are operated in the same way as $T_4$ and $T_{6a}/T_{6b}$, and therefore the same current will flow as in the replica bias circuit, thus: $I'_{ex}=I_{ex}$. Because the combined resistance of $T_{7a}$ and $T_{7b}$ depends on the common-mode level of $V_C$ and $V_D$, the presence of a differential voltage will not disturb this situation (provided the differential signal is not too large). One can further check that a decrease (resp. increase) of the common-mode level of the sense nodes Bn,Dn results in an increase (resp. decrease) of $I'_{ex}$, hence there is negative feedback. Also the loop gain can be derived.

The close integration of common-mode voltage extraction, error amplification and feedback current setting in the embodiment of FIG. 13 can be seen by analyzing the circuit. Indeed, if we denote by G/2 the transconductance of the identical transistors T6a, T6b, T7a, and T7b, it can be shown that:

$$I'_{ex} = I_{ex} + G \cdot \left(\frac{V_B + V_D}{2} - V_{ref}\right)$$

Here, the difference of the common-mode voltage of the sense nodes with the reference voltage $V_{ref}$ is implicitly present in the circuit operation. It is important to note that in this embodiment, the amplifier is also implicitly present. Those skilled in the art of integrated circuit design, will recognize that the loop gain of the feedback loop of FIG. 13 is determined by the product of G and the high output resistance of the current sources (the output resistance of both sources are in parallel). In this case, sufficient loop gain is not created by an explicit amplification block, but is eminent from the use of the current source $I'_{ex}$ in the feedback loop.

Figure 15:
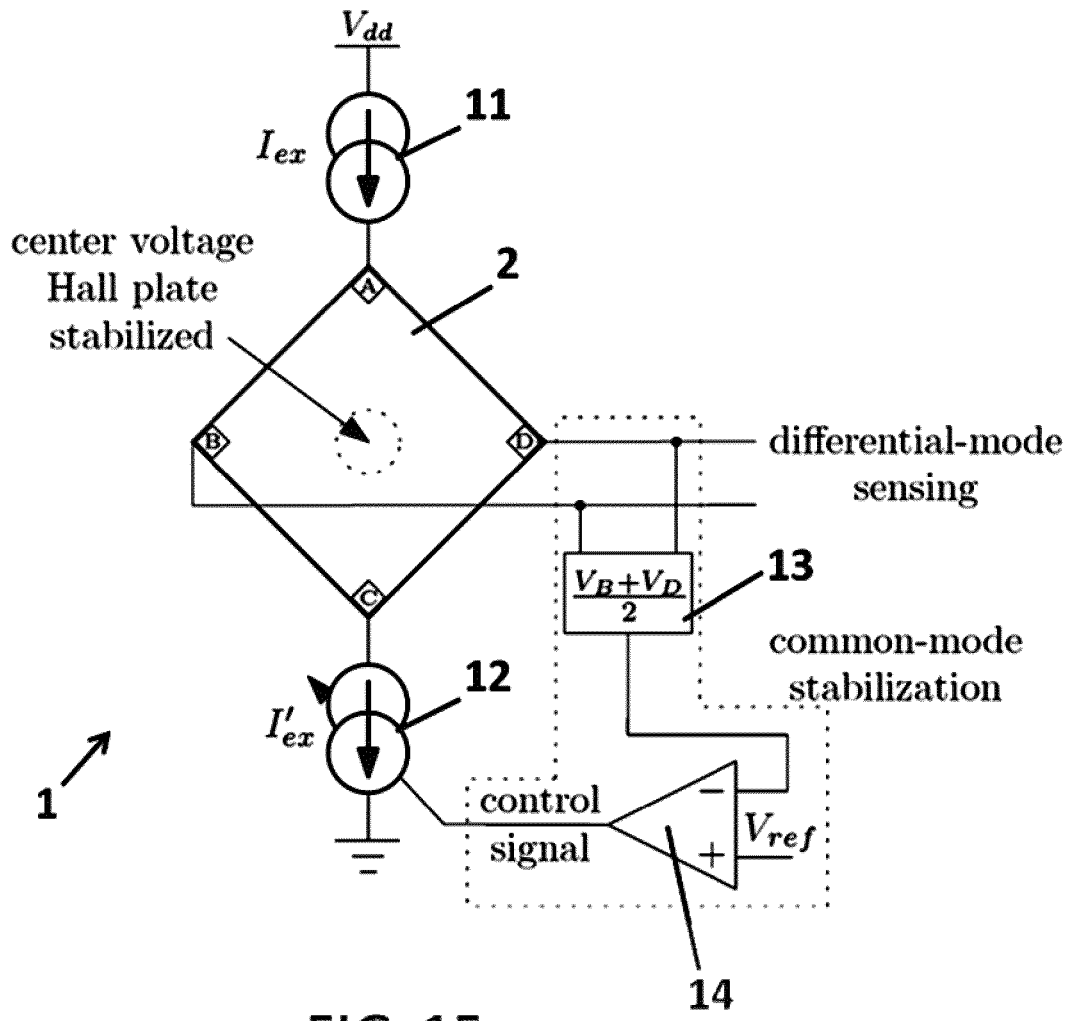
FIG. 15 shows a variant of the circuit of FIG. 6, where the position of the fixed and adaptable current source are changed.

Many variants of the presented solutions can be conceived. For instance, complementary circuits in which NMOS and PMOS switch roles can be derived. In these, the fixed excitation source 11 is at the top, while the adaptable current source 12 is at the bottom, as shown in FIG. 15. In an embodiment, the dependent current source 12 is a single NMOS transistor, which is preferably used in saturation mode, so that the drain-source voltage Vds over that transistor is substantially independent of the current $I'_{ex}$ flowing through it. This has the advantage that the voltage of the excitation node Cn of the plate 2 is substantially independent of the ground voltage. Other variants use bipolar transistors instead of MOSFETS for implementing circuits that are functionally quite similar to the presented CMOS circuits. The presented embodiments can therefore also be applied in bipolar and BiCMOS processes.

Also, many enhancements can be thought of: improved current mirrors (e.g. using cascoding), amplifiers with more gain, higher-order amplification loops with frequency compensation, etc. Also, further merging with the differential-mode readout circuits can be considered. As an example of this, reference is made to the embodiment shown in FIG. 14. This circuit is related to the one in FIG. 12, where two transistors $T_{5a}/T_{5b}$ are used in parallel (as part of a differential pair of the common-mode feedback loop). In this, the common-source point of $T_{5a}/T_{5b}$ contains the information on the average sense node voltage, up to a voltage drop $V_{GS}$ (gate-source). Transistor T4 and its biasing current sources (the two $I_b$ sources) can be dimensioned in such a way that it has the same $V_{GS}$. By also connecting the source of $T_4$ to the common-source of $T_{5a}/T_{5b}$, a differential pair arises which, as in FIG. 12, is able to detect a difference between the actual common mode level of the sense nodes, and the target level $V_{ref}$. The rest of the circuit amplifies this error signal, and adapts the current $I'_{ex}$ until the error signal becomes zero. This part of the solution is an example of a second-order amplification chain, which requires frequency compensation (e.g. using the capacitor Cc) to obtain a stable feedback loop.

In the examples shown, the average voltage of the sense nodes Bn, Dn is used as the common mode voltage $V_{cm}$, which is then compared to $V_{ref}$.

In the examples of FIG. 6 to FIG. 14, a square horizontal Hall plate is shown, where the excitation contacts A, C and the sense contacts B, D are located on the edges. This may offer the advantage that the contacts are located further apart, which increases the sensitivity of the sensor (because of a better geometry-factor). However, the invention would also work if the excitation contacts A, C and the sense contacts B, D would be located in the middle of the sides.

Example of Vertical Hall Plate

Next to horizontal Hall plates which are oriented parallel to the chip surface, other geometric configurations are possible that allow to sense certain magnetic field components.

Figure 16:
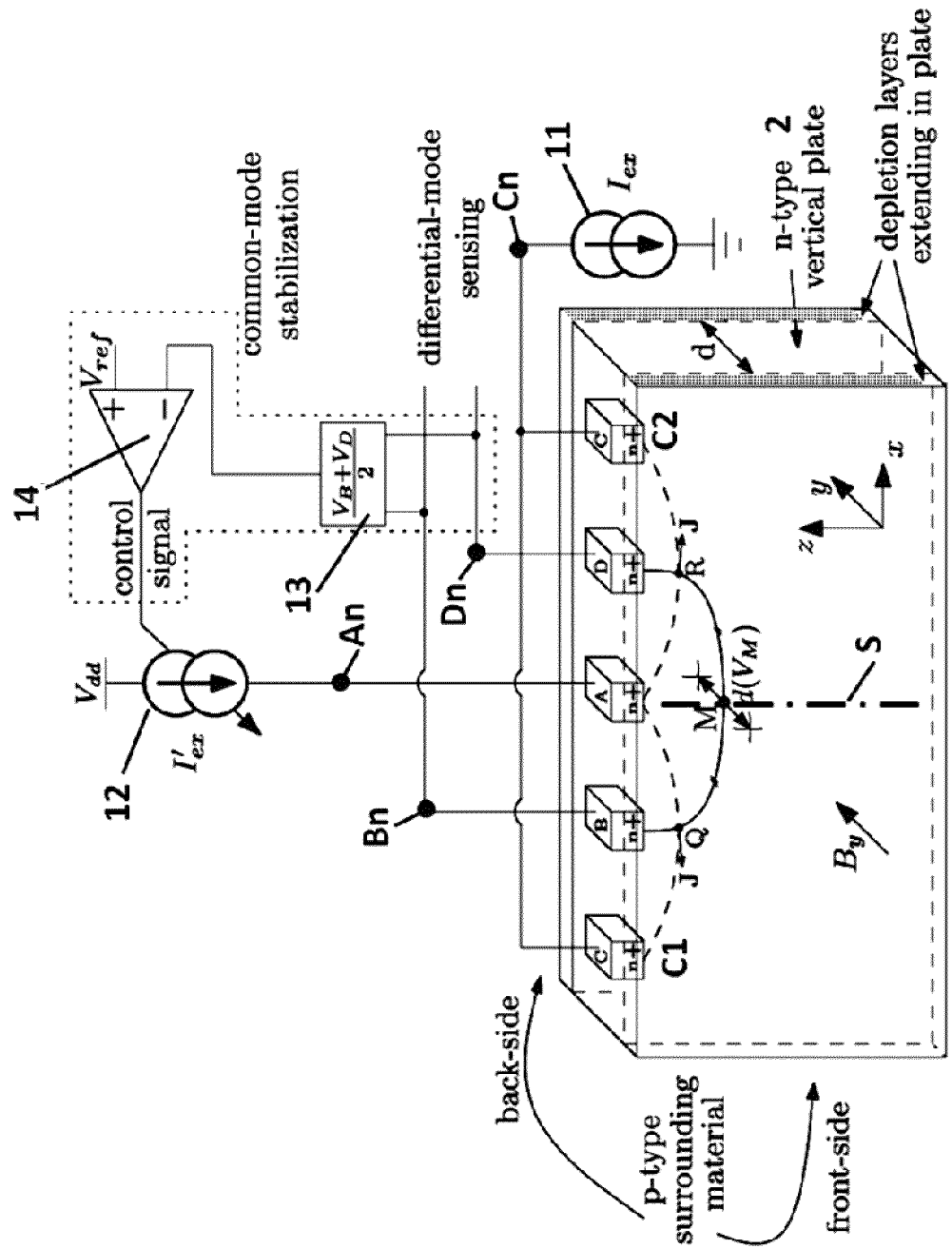
FIG. 16 shows an example of an integrated circuit according to the present invention, comprising a vertical Hall element.

Integrated Hall sensors which are able to sense in-plane magnetic fields are often called "vertical Hall devices". This is because the device region that plays the role of the Hall plate is now perpendicular to the chip plane. As described in the active zone of such a device can be n-type material partly confined into an approximately plate-like structure by a deep p-type ring around the structure. In FIG. 16, a schematic representation of an example of a vertical Hall device is given, and it is shown how the "floating biasing" approach as proposed by the present invention can be applied in this case.

An important difficulty in these Hall devices is that they can only be contacted at the side of the die surface, i.e. at only one side of the plate-structure. In the displayed example, five contacts A, B, C1, C2, D are used, but vertical Hall devices with a different number of contacts also exist. The middle contact corresponds with current-node An. The two outer contacts C1, C2 are connected electrically together, forming here the second current-node Cn. The two remaining contacts B, D correspond each with one of the sense nodes (Bn and Dn). The contacts A, B, C1, C2, D are located symmetrically w.r.t. the symmetry-axis S, which in the example of FIG. 16 runs through contact A, and is in the plane of the Hall plate 2. In this example, the magnetic field is assumed to be along the y-axis, and the Hall plate 2 is oriented orthogonally to the magnetic field B, i.e. in the xz-plane for the displayed example. The n-type vertical plate is surrounded at the front- and back side by p-type material. Due to the PN-junctions existing there, depletion regions extending into the plate exist. And similar as for the case of the horizontal Hall plate, the thickness 'd' of the plate 2 varies with the reverse-bias voltage over the PN-junctions. Apart from the fact that the plate 2 has a different orientation, the occurrence of depletion-effects that modulate the plate thickness 'd' in a voltage-dependent way is actually very similar as for horizontal Hall plates. S indicates the symmetry-axis of this Hall plate 2.

We will now prove why the "floating plate biasing" approach succeeds in substantially reducing the impact of depletion-layer effect on the Hall sensitivity in the case of vertical Hall devices. The derivation is very similar to the steps followed for the case of the horizontal Hall plate. Also here, we consider, for a zero magnetic field, the equipotential line connecting the two sense contacts B, D. This is not a straight line here, but the curved path B-Q-M-R-D (note that the displayed equipotential lines and current lines (dotted line from A to C1 and from A to C2) are only shown for illustrative purposes). The symmetry-requirements imply that also the equipotential line (or curve) B-Q-M-R-D is symmetric. The point at "the middle" (i.e. halfway) is denoted by 'M'. We now parameterize the path B-Q-M-R-D with the parameter s, in such a way that s=−1,0 and 1 correspond with the points B, M and D respectively, and equal increments in 's' correspond with an equal length traveled along the path. The current density J flowing through a point on the curve can then be denoted as J(s). The symmetry requirements imply that J(s) is an even function of s. This is also visualized on the figure: at two points Q and R along the path, which are at an equal distance from M, the current flow has exactly the same strength. If we now let the point M play the role of the "center", all elements are available to duplicate the theoretical derivations done for the horizontal plate. We conclude that also for the vertical Hall plate 2, the plate thickness 'd' at the point M matters the most, and that "floating plate biasing" as described in the present invention succeeds in stabilizing the voltage at that point.

Symmetry

The symmetry aspects for both horizontal and vertical Hall plates 2, may also be described as follows, and by considering a rotation of the Hall plate around the symmetry axis S. In order to make sure that in the absence of a magnetic field the voltage difference between the sense contacts B, D is zero, in many cases symmetric structures are used. The structure and contact placement are then in such a way that:
1) The structure, or the part of the structure where there is significant current flow, is symmetric w.r.t. a 180° rotation around an in-plane axis. Here, in-plane means within the plane of the Hall plate.
2) under the 180° rotation around this axis: a) each current node remain electrically invariant (i.e. contacts are allowed to switch position if they belong to the same electrical node), b) the two sense nodes are electrically swapped.

It is then possible to show that the voltage $VH=V_B-V_D$ between the sense nodes Bn, Dn is zero in the absence of a magnetic field. Indeed, before and after rotation, the current-flow is completely identical because the current contacts remain invariant under the rotation. However, because the sense contacts swap places during rotation, and because in the absence of a magnetic field the situation before and after transformation is exactly the same, we can deduce that the sensed voltage must be zero. The symmetry also implies that the Hall voltage is exactly opposite when the magnetic field changes sign.

It is expected that any integrated plate-like Hall sensor for which the above symmetry applies, and which is isolated from its surroundings through PN-junction, will benefit from reduced depletion-layer influences when the floating-plate biasing approach disclosed in the present invention is applied.

Example of a Set-Up for Van Der Pauw-Type Measurements

Figure 17:
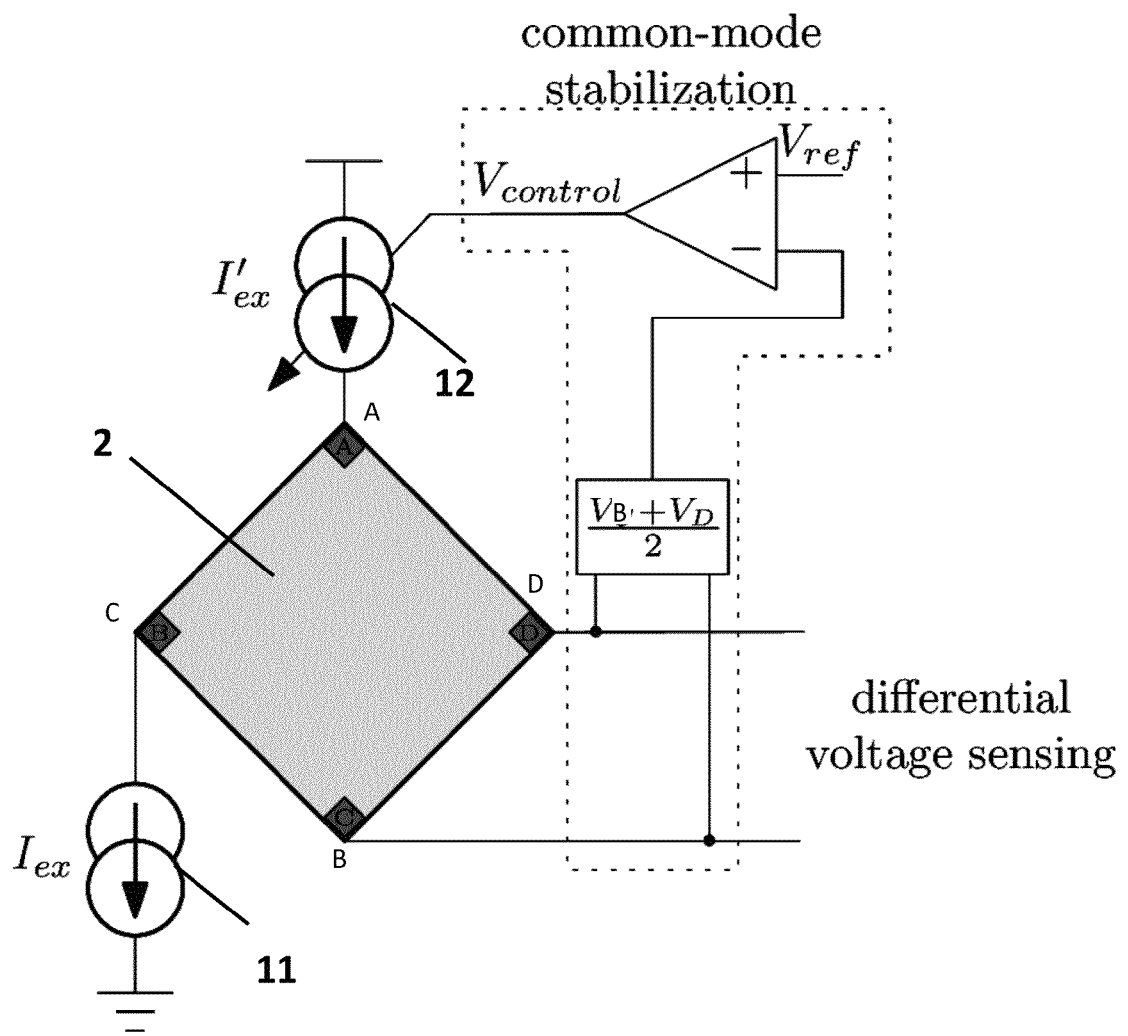
FIG. 17 shows an example of an integrated circuit according to further embodiments of the present invention, the Hall element being arranged for Van der Pauw-type measurements (with excitation applied to two nodes along a first edge, and sensing done at two nodes along another edge).

Although the set-up as described above is particularly useful for implementing embodiments of the present invention for Hall-type measurements, this invention is not limited thereto, and also works for instance for Van der Pauw-type measurements. An example is illustrated in FIG. 17, in which a Hall plate 2 is arranged for a Van der Pauw-type measurement. In this case, a Hall element 2 is used in which, when going along the perimeter of the Hall element, excitation nodes A, C are located adjacent one another, and sensing nodes B, D are located adjacent one another. In alternative embodiments, not illustrated here, excitation nodes and/or sensing nodes are not located at the edge of the plate. The order of the nodes can then be determined by virtually shrinking the plate until all contacts are located on the edge of the plate, after which the order of the nodes is defined by going along the perimeter of the plate.

For Van der Pauw-type measurements, the (differential) voltages to be sensed are typically much larger than for the Hall measurements, and the effects of the thickness variations over the plate become more prominent. Furthermore, various mismatches in contacts and the plate can easily translate into different profiles for the plate thickness (depletion layer effect), which can significantly affect the accuracy of the Van der Pauw measurements.

Embodiments of the present invention aid in minimizing the influence of the nonlinear depletion-layer effects, by stabilizing a linear combination of voltages at the sense nodes B, D. The biasing technique allows to stabilize the voltages near the center of the plate, without applying a fixed voltage to any of the nodes A, B, C, D, and without "contacting" the center region of the plate. With this biasing technique according to embodiments of the present invention, a change in any of the contact resistances, or the introduction of additional resistance in series with the plate (e.g. due to switches external to the plate), has limited to no effect on the potential within the plate (measured w.r.t. the substrate), and therefore does substantially not affect the Van der Pauw measurements. Furthermore, by stabilizing the voltages near the center of the plate, the distortion of the thickness profile is of even order, and typically smaller than if the voltage at some other point would be stabilized. The substrate and shield are fixed at ground voltage GND, which is widely applicable in contemporary technologies.

Again, as in the previous embodiments, two current sources $I_{ex}$, $I'_{ex}$ are used. A first predefined current source 11 defines the current $I_{ex}$ that leaves the Hall plate 2 at the node C. For the purpose of explaining the circuit, this can be considered as a fixed current source. The current value $I_{ex}$ set by this current source 11 accurately defines the bias current that will flow through the Hall plate 2. A second current source 12 is used which defines the current $I'_{ex}$ coming from the positive supply VDD and enters the Hall plate 2 at the node A. In order to work in practice, the currents $I_{ex}$ and $I'_{ex}$ need to be the same (in steady state). For this reason, the second current source 12 is adaptable, and will be controlled by means of a negative feedback loop, which among others will have the effect that both current sources 11, 12 will have exactly the same current (in steady state). Referring again to FIG. 17, it can be seen that the Hall plate 2 is connected to the supply voltage VDD and to the ground voltage GND through high-impedance sources, in particular two current sources 11, 12. With "high-impedance" is meant having an impedance higher than 10 KΩ, preferably higher than 100 KΩ. This offers the advantage of providing a good isolation of the sensing device from the often noisy supply VDD and ground connections. Because of its high isolation from supply and ground, this biasing approach is referred to as "floating plate biasing".

The functioning of this circuit is as set out above, for instance with relation to the circuit of FIG. 6.

REFERENCES

1 circuit
2 Hall plate
3 PN junction between Hall-plate and substrate or well
4 PN junction between Hall-plate and second shielding area
5 substrate or well 6 second shielding area
A,C,C1,C2 excitation contacts
An, Cn excitation nodes
B,D sense contacts
Bn, Dn sense nodes
M "center" of the plate
11 first current source
12 controllable second source
13 common mode voltage extraction circuit
14 amplifier
$V_{cm}$ common mode voltage
$V_{ref}$ reference voltage
R resistor
T transistor
$I_{ex}$ predetermined current
$I'_{ex}$ dependent current

The invention claimed is:

1. A circuit, comprising a plate-shaped sensor element made of doped semiconductor material,
   the plate-shaped sensor element having at least a first excitation contact connected to a first excitation node, and at least a second excitation contact connected to a second excitation node, and at least a first sense contact connected to a first sense node and at least a second sense contact connected to a second sense node;
   the plate-shaped sensor element being embedded in a substrate or well such that it is isolated from the substrate or well by means of a first PN-junction, the substrate or well being connectable to a first fixed voltage,
the circuit comprising:
   a) a first current source connectable to the first excitation node for applying a predefined first current;
   b) a controllable second source adapted for applying a second current to the second excitation node;
   c) a negative feedback loop for controlling the second source, based on a comparison between a value representative for a common mode voltage of the voltages of the sense nodes and a predefined reference voltage, such that the common mode voltage is substantially equal to the predefined reference voltage.

2. The circuit according to claim 1, wherein the predefined reference voltage is obtained from a fixed voltage source or from a variable voltage source arranged for providing a voltage dependent on temperature and/or stress of the plate-shaped sensor element.

3. The circuit according to claim 1, wherein the negative feedback loop comprises a common mode voltage extraction circuit for generating the common mode voltage, and an amplifier connected via its inputs to an output of the common mode voltage extraction circuit and to the reference voltage, wherein the amplifier is arranged for providing at its output the second current, or wherein the second source is a current source for generating the second current, an output of the amplifier being connected to a control input of the second source.

4. The circuit according to claim 3, wherein the amplifier is an operational amplifier arranged such that the loop gain of the feedback loop is at least 10.

5. The circuit according to claim 1, wherein each of the excitation nodes is connected to exactly one excitation contact of the plate-shaped sensor element, and wherein each of the sense nodes is connected to exactly one sense contact of the plate-shaped sensor element.

6. The circuit according to claim 1, wherein:
   the plate-shaped sensor element has a shape with a symmetry axis, and
   the excitation contacts are located on or symmetrically w.r.t. the symmetry-axis;
   the sense contacts are located symmetrically w.r.t. the symmetry-axis.

7. The circuit according to claim 1, furthermore comprising at least one shielding area, wherein the plate-shaped sensor element can be electrically isolated from each of the shielding areas by means of additional PN-junctions, each of the shielding areas being connectable to voltages which are fixed with respect to the first voltage.

8. The circuit according to claim 1, wherein the plate-shaped sensor element is a horizontal Hall plate or a vertical Hall plate.

9. The circuit according to claim 1, wherein the plate-shaped sensor element is configured to perform Van der Pauw-type measurements, wherein two consecutive nodes have a same function when going over the nodes in an order defined by following the edge of the plate.

10. The circuit according to claim 1, wherein the first current source is a switchable current source for allowing selection of one out of a plurality of predefined currents, or a variable current source arranged for providing the predefined first current as a current dependent on temperature and/or stress of the plate-shaped sensor element.

11. The circuit according to claim 1, further comprising means for measuring a voltage difference between the first and second sense node as an indication of a magnetic field component.

12. Method for biasing a plate-shaped sensor element made of doped semiconductor material, the plate-shaped sensor element having at least a first excitation contact connected to a first excitation node, and at least a second excitation contact connected to a second excitation node, and at least a first sense contact connected to a first sense node and at least a second sense contact connected to a second sense node; the plate-shaped sensor element being electrically isolated from a substrate or well by means of a first PN-junction, the substrate or well being connected to a first fixed voltage; the method comprising the steps of:
   a) applying to the first excitation node a predefined first current generated by a first current source;
   b) applying to the second excitation node a second current generated by a controllable second source;
   c) controlling the second source by means of a negative feedback loop based on a comparison between a value representative for a common mode voltage of the voltages of the sense nodes and a predefined reference voltage, such that the common mode voltage is substantially equal to the reference voltage.

13. The method according to claim 12, wherein the common mode voltage is generated by averaging the first and the second voltage of the sense nodes.

14. The method according to claim 12, wherein applying a predefined first current to the first excitation node and applying a second current to the second excitation node comprises applying the first current and the second current to two excitation contacts connected to the excitation nodes selected such that they are consecutive nodes when going over the nodes in an order defined by following the edge of the plate-shaped sensor element.

15. Method for measuring a magnetic field component using a plate-shaped sensor element made of doped semiconductor material, the method comprising the steps of:
   a) biasing the plate-shaped sensor element using a method according to claim 12;

b) measuring a voltage difference between the first and second sense node, as an indication of the magnetic field component.

16. Method for measuring stress using a plate-shaped sensor element made of doped semiconductor material, the method comprising the steps of
   a) biasing the plate-shaped sensor element using a method according to claim 14;
   b) measuring a voltage difference between the first and second sense node in a Van der Pauw set-up, as an indication of a stress component.

* * * * *

UNITED STATES PATENT AND TRADEMARK OFFICE
CERTIFICATE OF CORRECTION

| | | |
|---|---|---|
| PATENT NO. | : 9,170,308 B2 | Page 1 of 1 |
| APPLICATION NO. | : 14/055703 | |
| DATED | : October 27, 2015 | |
| INVENTOR(S) | : Raman et al. | |

It is certified that error appears in the above-identified patent and that said Letters Patent is hereby corrected as shown below:

<u>Title Page</u>
Add Item (30) foreign priority information GB1218580.7 filed October 16, 2012

Signed and Sealed this
Twenty-fourth Day of May, 2016

Michelle K. Lee
*Director of the United States Patent and Trademark Office*